(12) United States Patent
Carlough et al.

(10) Patent No.: US 11,088,782 B2
(45) Date of Patent: *Aug. 10, 2021

(54) USE OF A CYCLIC REDUNDANCY CODE MULTIPLE-INPUT SHIFT REGISTER TO PROVIDE EARLY WARNING AND FAIL DETECTION

(71) Applicant: International Business Machines Corporation, Armonk, NY (US)

(72) Inventors: Steven R. Carlough, Poughkeepsie, NY (US); Patrick J. Meaney, Poughkeepsie, NY (US); Gary Van Huben, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/715,162

(22) Filed: Dec. 16, 2019

(65) Prior Publication Data

US 2020/0119843 A1    Apr. 16, 2020

Related U.S. Application Data

(63) Continuation of application No. 15/817,416, filed on Nov. 20, 2017, now Pat. No. 10,541,782.

(51) Int. Cl.
*H04L 1/00* (2006.01)
*H03M 13/09* (2006.01)

(52) U.S. Cl.
CPC .......... *H04L 1/0061* (2013.01); *H03M 13/09* (2013.01); *H04L 1/0041* (2013.01);
(Continued)

(58) Field of Classification Search
CPC .................................................. H04L 1/0061
(Continued)

(56) References Cited

U.S. PATENT DOCUMENTS 5,200,930 A * 4/1993 Rouquette ............... G01V 1/22
367/76
5,734,826 A  3/1998 Olnowich et al.
(Continued)

FOREIGN PATENT DOCUMENTS

EP  1302382 A2  4/2003
EP  1826909 A2  8/2007
(Continued)

OTHER PUBLICATIONS

Baicheva, "Determination of the Best CRC Codes with up to 10-Bit Redundancy", IEEE, 2008, 7 pages.
(Continued)

*Primary Examiner* — Fritz Alphonse
(74) *Attorney, Agent, or Firm* — Cantor Colburn LLP; Steven Chiu

(57) ABSTRACT

Aspects of the invention include using a cyclic redundancy code (CRC) multiple-input signature register (MISR) for early warning and fail detection. Received bits are monitored at a receiver for transmission errors. The monitoring includes receiving frames of bits that are a subset of frames of bits used by the transmitter to generate a multi-frame CRC. At least one of the received frames of bits includes payload bits and a source single check bit not included in the multi-frame CRC. It is determined whether a transmission error has occurred in the received frames of bits. The determining includes generating a calculated single check bit based at least in part on bits in the received frames of bits, and comparing the received source single check bit to the
(Continued)

calculated single check bit. An error indication is transmitted to the transmitter if they don't match.

19 Claims, 14 Drawing Sheets

(52) U.S. Cl.
CPC .......... *H04L 1/0045* (2013.01); *H04L 1/0063* (2013.01); *H04L 2001/0094* (2013.01)

(58) Field of Classification Search
USPC ................................ 714/807, 805, 809, 804
See application file for complete search history.

(56) References Cited

U.S. PATENT DOCUMENTS

| | | | |
|---|---|---|---|
| 5,844,918 | A | 12/1998 | Kato |
| 6,169,728 | B1 * | 1/2001 | Perreault ................ H04H 20/42 348/E7.07 |
| 6,175,941 | B1 | 1/2001 | Poeppelman |
| 6,522,665 | B1 | 2/2003 | Suzuki |
| 6,598,189 | B1 | 7/2003 | Zhao et al. |
| 6,601,216 | B1 | 7/2003 | Obata |
| 6,658,076 | B1 | 12/2003 | Hayata |
| 6,820,228 | B1 | 11/2004 | Keller |
| 7,047,453 | B2 | 5/2006 | Lappin, Jr. |
| 7,162,683 | B2 | 1/2007 | Bune |
| 7,227,797 | B2 | 6/2007 | Thayer |
| 7,411,522 | B2 | 8/2008 | Yamanshi |
| 7,523,305 | B2 | 4/2009 | Skovira |
| 7,613,991 | B1 | 11/2009 | Bain |
| 7,788,476 | B2 * | 8/2010 | McNutt ............... H04L 25/4908 713/1 |
| 8,074,150 | B2 | 12/2011 | Buckley et al. |
| 8,099,651 | B2 | 1/2012 | Normoyle et al. |
| 8,332,721 | B2 | 12/2012 | Lawson |
| 8,352,830 | B2 | 1/2013 | Landschaft |
| 8,601,345 | B1 | 12/2013 | Huang |
| 9,287,896 | B2 | 3/2016 | Seo et al. |
| 9,298,668 | B2 | 3/2016 | Thayer |
| 2002/0012343 | A1 | 1/2002 | Holloway et al. |
| 2003/0093743 | A1 | 5/2003 | Berry, Jr. et al. |
| 2004/0068689 | A1 | 4/2004 | Saxena |
| 2004/0123221 | A1 | 6/2004 | Huffman et al. |
| 2004/0158794 | A1 | 8/2004 | Niesen |
| 2005/0144222 | A1 | 6/2005 | Anderson et al. |
| 2005/0163235 | A1 | 7/2005 | Mo et al. |
| 2007/0297451 | A1 | 12/2007 | Kim |
| 2008/0186988 | A1 | 8/2008 | Carmon |
| 2010/0205518 | A1 | 8/2010 | Golitschek Edler Von Elbwart et al. |
| 2010/0287441 | A1 | 11/2010 | Seo |
| 2011/0004817 | A1 | 1/2011 | Cheong et al. |
| 2013/0080862 | A1 | 3/2013 | Bennett |
| 2013/0100012 | A1 | 4/2013 | Todorovich et al. |
| 2013/0132796 | A1 | 5/2013 | Vummintala |
| 2013/0145229 | A1 | 6/2013 | Frayer |
| 2013/0290802 | A1 | 10/2013 | Busaba et al. |
| 2013/0290803 | A1 | 10/2013 | Busaba et al. |
| 2014/0089516 | A1 | 3/2014 | Sevin |
| 2014/0328256 | A1 | 11/2014 | Djukic |
| 2015/0071620 | A1 | 3/2015 | Keohane |
| 2015/0378823 | A1 | 12/2015 | Lesartre |
| 2016/0087825 | A1 | 3/2016 | Tian et al. |
| 2016/0217030 | A1 | 7/2016 | Shin |
| 2017/0075754 | A1 | 3/2017 | Wang |
| 2018/0062787 | A1 | 3/2018 | Hsieh |
| 2019/0158125 | A1 | 5/2019 | Carlough |
| 2019/0158126 | A1 | 5/2019 | Carlough |
| 2019/0158218 | A1 | 5/2019 | Carlough |
| 2019/0158223 | A1 | 5/2019 | Carlough |

FOREIGN PATENT DOCUMENTS

| | | |
|---|---|---|
| EP | 1742498 A1 | 10/2007 |
| EP | 2264905 A1 | 12/2010 |
| WO | 2004086633 A1 | 10/2004 |
| WO | 2009156798 A1 | 12/2009 |
| WO | 2014204373 A1 | 12/2014 |
| WO | 2016108556 A1 | 7/2016 |

OTHER PUBLICATIONS

Gangopadhyay et al., "Multiple-bit Parity-based Concurrent Fault Detection Architecture for Parallel CRC Computation", IEEE, 2015, 14 pages.

List of IBM Patents or Patent Applictions Treated As Related; (Appendix P), Filed Dec. 16, 2019, 2 pages.

May, Phil, et al., "Improvement in bit-error rate for optoelectronic multicomputer interconnection networks using cyclic redundancy code error detection", IEEE Photonics Technology Letters 9.6 (1997): 848-850.

Moon, Jaekyun, et al.,"Cyclic redundancy check code based high-rate error-detection code for perpendicular recording", IEEE transactions on magnetics 42.5 (2006): 1626-1628.

Salmistraro et al., "Rate-adaptive BCH codes for distributed source coding", Springer, 2013, 14 pages.

* cited by examiner

USE OF A CYCLIC REDUNDANCY CODE MULTIPLE-INPUT SHIFT REGISTER TO PROVIDE EARLY WARNING AND FAIL DETECTION

DOMESTIC PRIORITY

This application is a continuation of U.S. patent application Ser. No. 15/817,416, filed Nov. 20, 2017, the content of which is incorporated by reference herein in its entirety.

BACKGROUND

Embodiments of the present invention relate in general to cyclic redundancy codes (CRCs) and more specifically to using a CRC multiple-input shift register (MISR) to provide early warning and fail detection.

A CRC is an error-detecting code that is commonly used in digital networks and storage devices to detect errors in transmitted data. In transmissions involving packet or frame based protocols a CRC is often used to protect the data that is being carried within a packet or frame of bits. A short check value (e.g., a CRC) is attached to blocks of data entering these systems. The short check value is derived using contents of the data blocks and can be calculated, for example, based on the remainder of a polynomial division of the contents of the data blocks.

In many applications it is sufficient to simply use a CRC as a means of determining success or failure in delivering a frame from a source to a destination. However, in some applications it is desirable to know failure information about the packet, or frame. The need for additional failure information often leads to the use of more complex CRCs which provide either improved error rate detection and/or isolation metrics. In cases where applications are characterized as having high performance requirements, payload bandwidth can suffer from the presence of robust CRC protection because more CRC bits are required to provide more robust CRC protection and the ratio of payload bits to CRC bits in a frame transmission decreases. During system initialization, compromises are often made in balancing high bandwidth and reliability when selecting a level of CRC protection for transmitted data.

SUMMARY

Embodiments of the present invention include methods, systems, and computer program products for using a cyclic redundancy code (CRC) multiple-input shift register (MISR) to provide early warning and fail detection. A non-limiting example method includes monitoring bits received at a receiver via a communication channel for transmission errors. The monitoring includes receiving frames of bits from a transmitter communicatively coupled to the receiver via the communication channel. The received frames of bits are a subset of frames of bits used by the transmitter to generate a multi-frame cyclic-redundancy code (CRC). At least one of the received frames of bits includes payload bits and a source single check bit not included in the multi-frame CRC. The source single check bit is generated by the transmitter based at least in part on bits transmitted by the transmitter to the receiver. The method further includes determining whether a transmission error has occurred in the received frames of bits. The determining includes generating a calculated single check bit based at least in part on bits in the received frames of bits and comparing the received source single check bit to the calculated single check bit. It is determined that a transmission error has occurred when the received source single check bit does not match the calculated single check bit. An error indication is transmitted to the transmitter based on determining that a transmission error has occurred.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
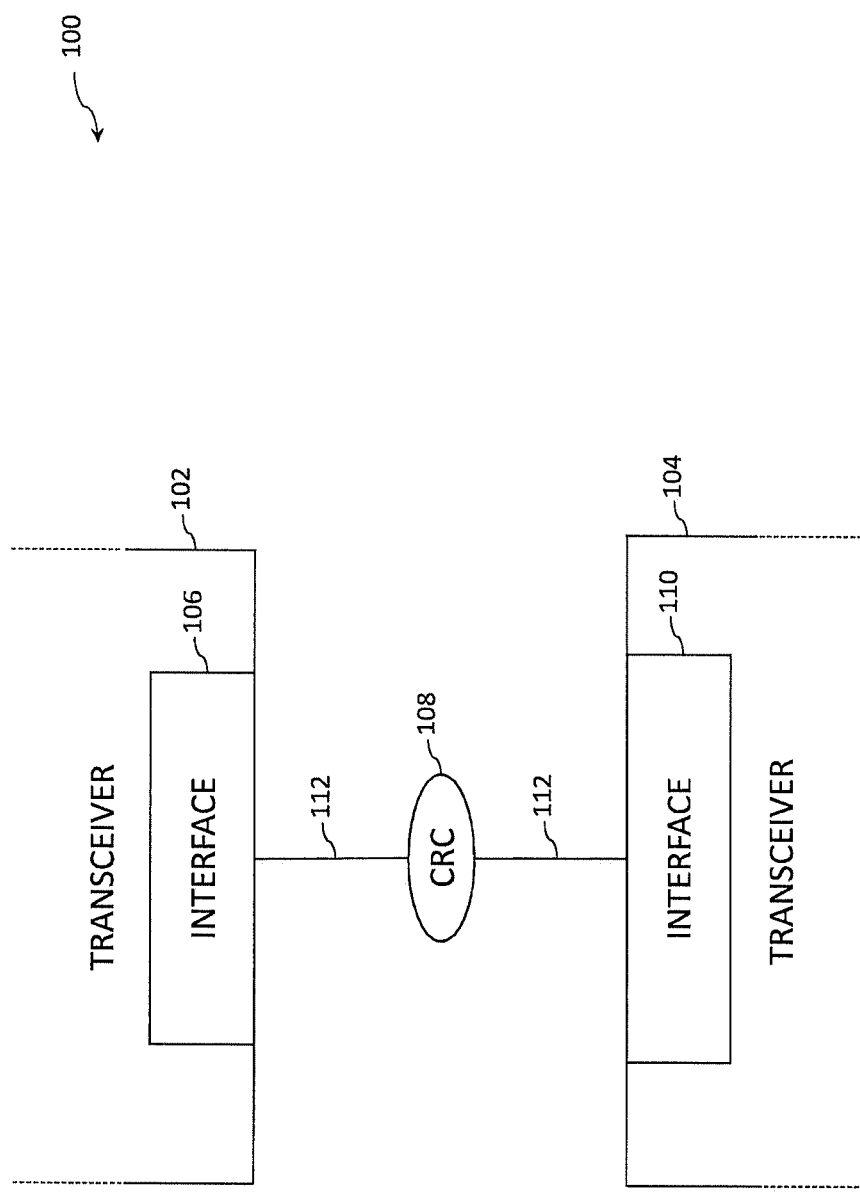
FIG. 1 depicts a high level block diagram of a system for data transmission in accordance with one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

One or more embodiments of the present invention provide an early warning indicator of potential failures in data that is transmitted in a packet or frame based protocol across a physical channel. The early warning can be generated at time frames that are between multi-frame CRC checks and can allow for more frames to be included in each multi-frame CRC as well as more time between each CRC check. Depending on the applied CRC, the early warning can provide sufficient confidence such that it allows the sender to retire resources or otherwise optimize a retry and recovery process at the sender.

In accordance with one or more embodiments of the present invention, the indicator is implemented by a CRC multiple-input shift register (MISR) bit that is included in all or a subset of the payload frames to provide early warning of a potential future CRC error. The CRC MISR bit can be inserted into payload frames in applications where space is available or affordable (e.g., based on performance requirements). In accordance with one or more embodiments of the present invention, a full CRC frame is transmitted every "N" frames based on a chosen CRC-to-payload ratio. Additionally, every "M" frames is used to convey a single CRC MISR bit which is the output of a MISR circuit that takes, for example, the existing partial CRC bits and applies a linear shift polynomial (e.g., parity, exclusive-or) chosen in conjunction with the CRC type to ensure sufficient transition density (e.g., to boost the level of confidence that errors will be detected).

As used herein, the term "transition density" refers to how often a signal switches from a zero to a one (or from a one to a zero) over some arbitrary time period. In accordance with one or more embodiments of the present invention, the MISR bit is used as a confidence booster to allow extended periods of time before performing a full CRC check. This makes it important to avoid as many false positives as possible on the MISR check. For example, false positives can become an issue if a protocol is used where lots of the bits in the packet are always zero and it leads to CRC values that are stagnant in a way such that when they are input to the MISR, the CRC MISR bit value that is output is a stream of zeros with occasional ones. In this case even if a wire on the interface is shorted to ground, the receiving side continues to see a stream of expected zeros. Thus, to the receiving side it appears that everything is running without errors even though there is a problem on the interface. The errors will likely be caught when the full CRC is transmitted. However, if the time is extended between full CRCs, this can impact how long detection takes, which may require more retry buffer space. To avoid this issue, one or more embodiments of the present invention select CRC codes and MISR tap points mathematically such that no matter how stagnant the packets are, there will be enough transitions on the MISR to elevate a confidence level that the interface is functioning without errors. Scrambling may also be used to periodically invert the data in a pseudo-random fashion (at the driver and later unscrambled at the receiver) such that all zeros on a bus show up physically as a relatively even mix of ones and zeros.

In accordance with one or more embodiments of the present invention, a matching (to the MISR on the transmitting side) MISR on the receiving side performs a compare of the single check bit (also referred to herein as the "source single check bit" or "CRC MISR bit") that was sent by the transmitting side. An advantage of this approach is that in exchange for a small bandwidth penalty (e.g., one bit ever four or five frames), full CRC checking can be extended while reducing the probability of not finding out about a CRC error until the full CRC check is performed.

In one example, a ten bit CRC code can be used to protect payloads having thirty-two bits. If the CRC bit to payload ratio is one to ten (1:10), then for every three-hundred and twenty payload bits (ten frames), a frame of ten CRC bits are transmitted. This amounts to a ten divided by three-hundred and twenty (10/320), or 3.125%, bandwidth impact. Now consider using an exemplary embodiment of the present invention to include a single CRC MISR bit every five frames. With an appropriately paired CRC code and MISR, the equivalent of the full ten bit code can be sent after fifty frames. So even though the payload incurs a one bit impact every five frames, the CRC-to-payload ratio can be extended from one to ten (1:10) ratio to a one to fifty (1:50) ratio with a high probability of detecting a problem early enough to enact a recovery procedure.

The use a CRC MISR bit as described herein provides the ability to apply a probability assessment in determining the extent of recovery resources required to define a reasonable boundary between recoverable and unrecoverable scenarios. For instance, in the above example, it could be deemed that the probability of not detecting an error until the full CRC is sent on the fiftieth frame is so unlikely that it's not necessary to implement the full resources needed to retry fifty frames worth of transactions. If, for example, the CRC code and MISR create transition density amounting to a 95% confidence level of detecting an error within the first twenty frames, then only twenty frames worth of retry resource may be deemed acceptable. The remaining 5% can be handled as a detected but unrecoverable event.

In one or more embodiments of the present invention, the CRC MISR bit is sourced from the side of the interface generating the CRC and ultimately sending the full CRC frame. A related exemplary embodiment of the present invention applies the same MISR concept but reverses the transmission direction of the CRC MISR bit. In certain applications, it may be desirable or necessary for both sides to implicitly generate and track the CRC MISR bits separately, but have the receiving side send its copy of the CRC MISR bit to the transmitting side for comparison, even if the transmitting side will ultimately send the full CRC frame. Conceptually there is no difference as long as an interface exists for one side to exchange the CRC MISR bit with the other side for comparison. This type of arrangement, where the CRC MISR bit is generated on the receiving side, can be used in a distributed memory buffer structure on a data chip interface where performance critical fetch data may not be able to tolerate insertion of a single CRC MISR bit at a high rate. However, the store data interface in the opposite direction might be able to afford incorporating two CRC MISR bits every four or five frames, one representing the CRC protecting the store data interface and the other bit representing the CRC protecting the fetch data interface. In this manner, the fetch data bus is predominately free to send data packets other than the occasional slot where it must send the full CRC frame. By incorporating one or more embodiments of the present invention, inclusion of the intermediate CRC MISR bit to provide a high probability of early warning permits the overall CRC-to-payload ratio to be extended to further improve overall system fetch bandwidth.

As used herein, the term "multi-frame CRC" refers to CRC bits that are calculated over a plurality of frames.

In accordance with one or more embodiments of the present invention, the ratio of the number of CRC bits to the number of payload bits transmitted over a unit of time in a packetized or frame based protocol can be dynamically adjusted to provide different levels of error detection and error isolation. One or more embodiments of the present invention provide a transition from one CRC rate to another while functional operations are performed by the system.

In accordance with one or more embodiments of the present invention, the type of CRC protection applied to a payload of information transmitted over a unit of time in a packet or frame based protocol can be dynamically adjusted to provide different levels of error detection and error isolation. One or more embodiments of the present invention provide a transition from one CRC code to another CRC code while functional operations are performed by the system.

As used herein, the term "functional operations" can refer to all or a portion of a host transmitting instructions (downstream) to read from or to write to memory or storage devices, the receiving device executing the instructions, and then transmitting a response (upstream) back to the host. The upstream responses may be in the form of completion responses or error indicators. Upstream data can also be transmitted as part of functional operations, for example, in the case of fetch operations. Functional operations can also refer to more extensive operations such, but not limited to, those performed by field-programmable gate arrays (FPGAs), cognitive engines, and graphics processing units (GPUs) using, for example, the OpenCAPI™ protocol. In addition to simple memory read and write operations, these devices assist the processor by offloading and performing coherent modifications of large quantities of data such as, but not limited to, images and databases.

The term "packet" refers to a formatted unit of data transmitted between an origin and a destination on the Internet or any other packet-switched network. A packet typically includes user bits (also referred to herein as a "payload") and control information that is used to deliver the payload. Examples of packet based protocols include, but are not limited to, Internet Protocol and OpenCAPI. The term "frame" refers to data that is transmitted between an origin and a destination as a unit. A frame can be transmitted serially (bit by bit) and can include frame synchronization bits to indicate the beginning and end of the payload data within a frame. Examples of frame based protocols include, but are not limited to, Ethernet and Peripheral Component Interconnect (PCI). It should be noted that that terms packet and frame are synonymous and that most protocols include multiple "packets" of information that together comprise a "frame." The terms "packet" and "frame" are used interchangeably herein to refer to data (e.g., payload bits and/or CRC bits) that is transmitted as a unit from an origin to a destination. In an embodiment, the origin is a memory buffer and the destination is a host computer, or memory controller. In another embodiment, the origin is a host computer, or memory controller, and the destination is a memory buffer. In a further embodiment, the origin is a transmitter in a first network location and the destination is a receiver in a second network location.

Depending on the channel transmission medium, it is not uncommon to be able to transmit packets error free for very long periods of time and then occasionally observe a small number of bit errors for a temporary period of time. This implies that most of the time bandwidth is being unnecessarily sacrificed for CRC bits. However, since it is not possible to predict when (or if) this temporary error window will occur, and leaving the packets completely unprotected is typically deemed unacceptable, the de-facto standard is to accept some type of bandwidth overhead penalty by using CRC bits.

According to one or more embodiments of the present invention, the ratio of CRC protection bits to payload bits is dynamically adjusted depending on actual bit error rates (BERs) encountered during data transmission. Dynamic adjustment of the CRC rate can be performed in a high reliability, availability, and serviceability (RAS) environment where it is deemed critical to perform various types of fail isolation.

One or more embodiments of the present invention allow for the use of agnostic protocols when the channel that the data is being transmitted over connects two autonomous entities capable of influencing data coherency. In one or more embodiments of the present invention, the host computer, or host, is not aware of the type of memory connected to it (e.g. DDR3 or DDR4). The host, for example, sends sequences of reads and writes to a memory buffer and expects the memory buffer to process them in a coherent manner. If, for example, there were no CRC protection and a command was missed (or misinterpreted) then there is a risk of not detecting a read versus write collision, and thus updating or returning data in a non-coherent fashion. This example highlights the importance of proper CRC protection, especially in a high RAS environment.

One or more embodiments of the present invention provide the ability to scale back CRC protection in favor of maximizing payload, to monitor the transmissions for errors, and to elevate the level of CRC protection commensurate to an observed error rate. Programmable registers can be located on both sides of the transmission interface to denote how many consecutive frames contain only a payload (i.e., no CRC bits), and a frame containing CRC bits is transmitted after the specified number of consecutive payload-only frames.

According to one or more embodiments of the present invention, the type of CRC is dynamically adjusted based on factors such as BERs and/or error isolation goals. One or more embodiments of the present invention utilize a two-dimensional CRC strategy that employs a plurality of CRC codes optimized for either frame isolation or lane isolation. Packets can initially start out with a frame based protection CRC which optimizes the CRC bits to identify any frames that have data errors. This can prevent an autonomous memory controller from creating a data integrity situation by acting on an erroneous frame.

Upon detection of a bad frame, either via a full CRC check or via CRC MISR bit compare, a recovery sequence can be enacted to identify the bad frame and to have the transmitting side (e.g., the host) determine whether the bad frame and any subsequent frames require retransmission. In accordance with one or more embodiments of the present invention, a CRC control module, which may include a frame-based register, is used to dynamically elevate the CRC rate (i.e., the ratio of payload bits to CRC bits) and also to switch the CRC code to a lane isolation code based on the premise that the error rate is frequent enough such that upon resuming normal traffic it is now desirable to isolate which lane is at fault. This presents an opportunity to perform lane steering in topologies that support lane steering. By using this two-dimensional CRC strategy, a single frame can carry a frame detect CRC capable of detecting any bad frame even over a very long stream of contiguous payload-only frames. Only when errors occur are the CRC bits re-purposed to focus on lane isolation which may necessitate transmitting fewer consecutive payload-only frames before performing the CRC check.

In accordance with one or more embodiments of the present invention, a plurality of CRCs which might be customized for different types of transmissions or variable size interfaces are utilized. So, in addition to simply switching between a frame detection CRC and a lane isolation CRC, one or more embodiments of the present invention permit switching between a plurality of different CRCs (e.g., lane based, frame based, beat based, etc.) depending on a format and structure of the payload. This can be particularly advantageous in the cases where the interfaces in each direction are asymmetrical and have different widths. In addition, certain interfaces also allow for the width to vary depending on operating parameters such as, but not limited to: operational modes and power savings features, thereby benefiting from a CRC code tailored to match the current interface configuration.

Turning now to FIG. 1, a high level block diagram of a system 100 for data transmission is generally shown in accordance with one or more embodiments of the present invention. FIG. 1 depicts a transceiver 102 having an interface 106 to a communication channel 112 for transmitting data to another transceiver 104 that also has an interface 106 to the communication channel 112. The communication channel 112 can be implemented as two unidirectional buses (one bus in each direction, each bus checked with CRC), or it can be implemented as a bi-directional bus with CRC checking in each direction. In an embodiment of the present invention, the communication channel 112 includes several wires or data bit lanes for transmitting data bits in parallel. In another embodiment of the present invention, the communication channel 112 is made up a single data bit lane and bits are sent one at a time in a serial manner. As shown in FIG. 1, errors in the data transmitted across the communication channel 112 are detected using CRC 108. In accordance with an embodiment of the invention, either transceiver 102 or transceiver 104 can act as a transmitter of data or as a receiver of data across the communication channel 112. In an embodiment of the present invention, CRC control instructions, and optionally a programmable register, to perform a CRC check and modify the CRC (e.g., rate or type) as described herein are located in and/or executed by each of the transceivers 102 104. The system 100 shown in FIG. 1 is an example of a system having a single communication channel between a transmitter of frames of bits and a receiver of the frames of bits. The number and/or type of wires or data lanes in each direction across the communication channels may be different. As used herein, the term "CRC" is generally used to refer to both multi-frame CRC processing and a single check bit, or CRC MISR bit, processing. Thus, increasing the CRC rate and changing the CRC type can apply to one or both of the multi-frame CRC and the CRC MISR bit.

In an embodiment of the present invention, the system 100 shown in FIG. 1 is a communication system for sending frames between a transmitter and a receiver. In an embodiment, the communication channel 112 includes a physical link that is provided between the transmitter and receiver. The physical link can include one or more wires connecting the transmitter and receiver by way of a cable, backplane (or planar board or motherboard), connectors, cards (or expansion cards), ball grid array (BGA) packaging, flip chip packaging, etc. In another embodiment, a wireless link is provided between the transmitter and the receiver and wireless communications that employ a packet protocol whose transmission is CRC protected are implemented.

In an embodiment of the present invention, the system 100 shown in FIG. 1 is a memory subsystem such as that shown in FIG. 4 below where transceiver 102 is implemented by a host computer, or memory controller, transceiver 104 is implemented by a unified memory buffer, and communication channel 112 is implemented by a high speed memory channel.

In one or more embodiments of the present invention, the communication channel 112 is unidirectional and one or both of transceiver 102 and transceiver 104 are implemented by a transmitter and/or a receiver.

Figure 2:
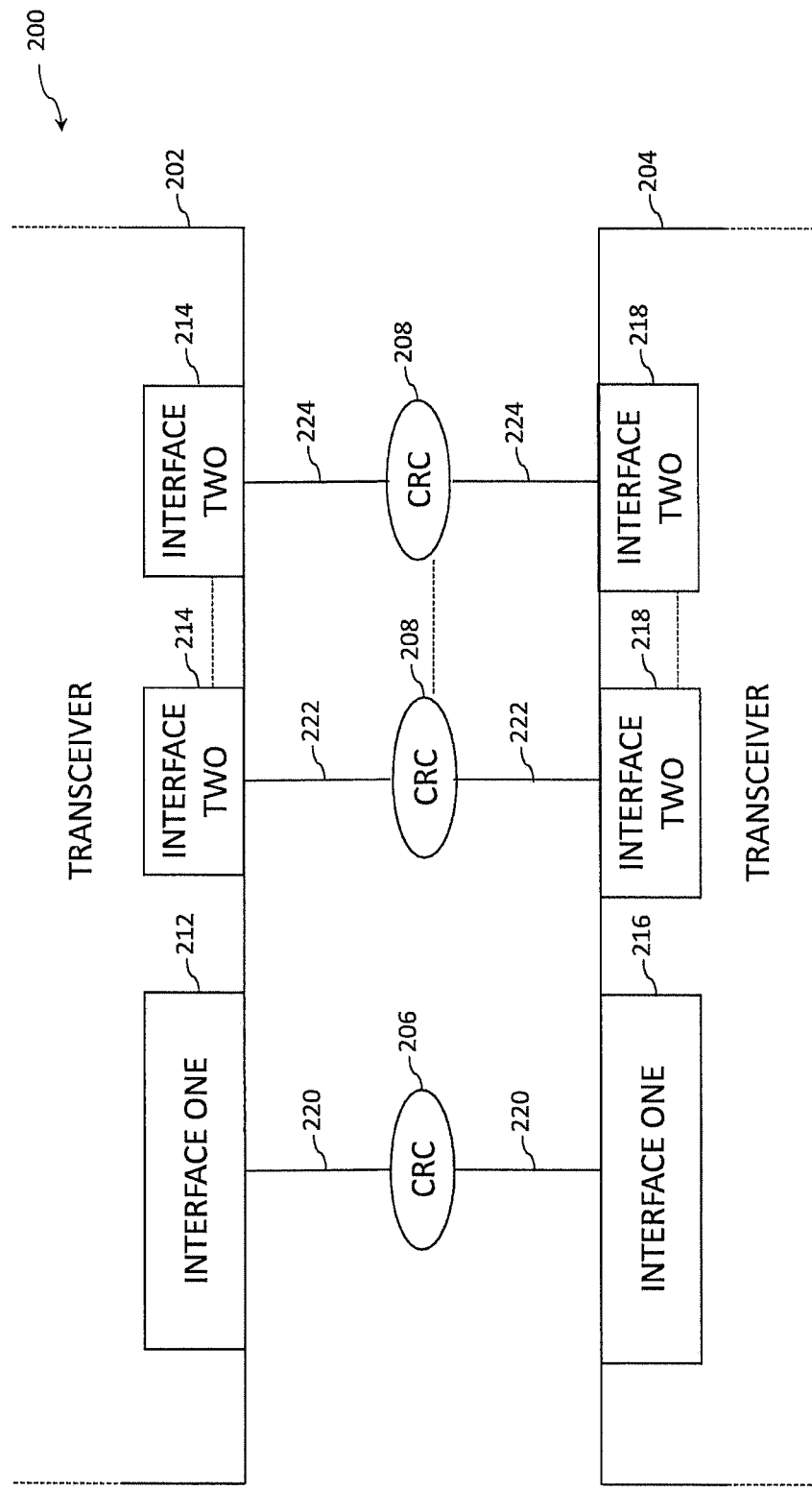
FIG. 2 depicts a high level block diagram of a system for data transmission in accordance with one or more embodiments of the present invention.

Turning now to FIG. 2, a high level block diagram of a system 200 for data transmission is generally shown in accordance with one or more embodiments of the present invention. FIG. 2 depicts a transceiver 202 having two different interfaces 212 214 to three different communication channels 220 222 224 for transmitting data to another transceiver 204 that has corresponding interfaces 216 218 to the three different communication channels 220 222 224. As shown in the example embodiment in FIG. 2, communication channels 222 224 are the same type of communication channels and they are different than the type of communication channel 220. Differences can include but are not limited to: speed; bi-directional or unidirectional; number or type of wires; number or type of data lanes; type of data; and/or RAS requirements.

As shown in FIG. 2, transceiver 202 includes interface one 212 to communicate with communication channel 220 and transceiver 204 includes interface one 216 to communicate with communication channel 220. Interface one 212 on transceiver 202 and interface one 216 on transceiver 204 can both include CRC control instructions to communicate as described herein to coordinate a rate and type of the CRC 206 on communication channel 220. Also as shown in FIG. 2, transceiver 202 includes interface two 214 to communicate with transceiver 204 via communication channel 222 and interface two 218 to communicate with transceiver 204 via with communication channel 222. Interface two 214 on transceiver 202 and interface two 218 on transceiver 204 can include CRC control instructions to communicate as described herein to coordinate a rate and type of the CRC 208 on communication channel 222. Also as shown in FIG. 2, transceiver 202 includes interface two 214 to communicate with communication channel 224 and transceiver 204 includes interface two 218 to communicate with communication channel 224. Interface two 214 on transceiver 202 and interface two 218 on transceiver 204 can include CRC control instructions to communicate as described herein to coordinate a rate and type of the CRC 208 on communication channel 224.

In an embodiment of the present invention, one or more of communication channels 220 222 224 includes several wires or data bit lanes for transmitting data bits in parallel. In an embodiment of the present invention, one or more of communication channels 220 222 224 are made up a single data bit lane and bits within a frame are sent one at a time in a serial manner. As shown in FIG. 2, errors in the data transmitted across communication channel 220 are detected using CRC 206 and errors in the data transmitted across communication channels 222 224 are detected using CRC 208.

In accordance with an embodiment of the invention, transceiver 102 or transceiver 104 can act as a transmitter of data or as a receiver of data across the communication channels 220 222 224. In an embodiment of the present invention, CRC control instructions to perform a CRC check and to modify the CRC (e.g., rate or type) as described herein are located in and/or executed by each of the transceivers 202 204. The system 200 shown in FIG. 2 is an example of a system having multiple different types of communication channels between a transmitter of fames of bits and a receiver of the frames. The multiple communication channels can be of the same or different types and the CRC codes can be the same (e.g., CRC rate, CRC type) or they can be different.

In an embodiment of the present invention, the system 200 shown in FIG. 2 is a communication system for sending fames between a transmitter and a receiver. In an embodiment, the communication channels 220 222 224 include at least two different types of links that are provided between the transmitter and the receiver. One or more of the links can be a physical link that can include one or more wires connecting the transmitter and receiver by way of a cable, backplane (or planar board or motherboard), connectors, cards (or expansion cards), ball grid array (BGA) packaging, and/or flip chip packaging, etc. One or more links could also be a wireless link provided between the transmitter and the receiver, supported by wireless communications that employ a packet protocol whose transmission is CRC protected.

In an embodiment of the present invention, the system 200 shown in FIG. 2 represents a single logical interface where interface one 212 is used to convey frames of command/address/control bits and interface two 214 is used to convey frames of data bits. In an embodiment of the present invention, each link shown in FIG. 2 is logically discrete with communication channel 220 implemented with a cabled connection, and communication channels 222 224 are implemented as traces on a backplane connecting transceivers on chips.

In an embodiment of the present invention, the system 200 shown in FIG. 2 is a memory subsystem such as that shown in FIG. 3 below, where transceiver 202 is implemented by a host computer, or memory controller, transceiver 204 is implemented by a distributed memory buffer, and communication channels 220 220 224 are implemented by high speed memory channels.

In one or more embodiments of the present invention, one or both of transceiver 202 and transceiver 204 are implemented by a transmitter and/or a receiver. In one or more embodiments of the present invention, two or more of interface one 212 and interfaces two 214 in transceiver 202 are implemented by different types of transmitters, receivers and/or transceivers. In one or more embodiments of the present invention, two or more of interface one 216 and interfaces two 218 in transceiver 204 are implemented by different types of transmitters, receivers and/or transceivers.

In one or more embodiments of the present invention, one or more of the communication channels 220 222 224 is unidirectional and one or both of transceiver 202 and transceiver 204 are implemented by a transmitter and/or a receiver.

Figure 3:
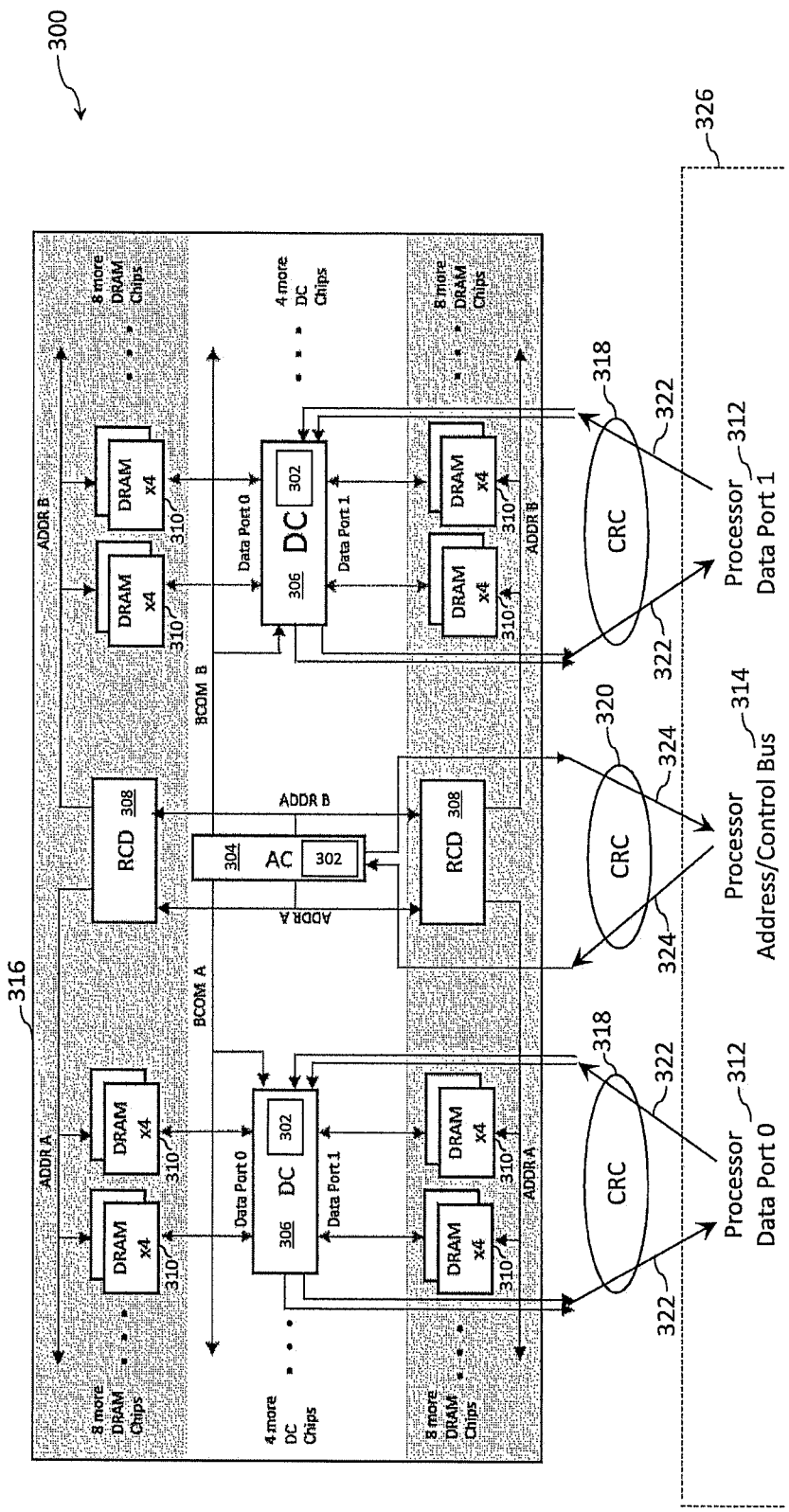
FIG. 3 depicts a block diagram of a system that includes a distributed memory buffer in accordance with one or more embodiments of the present invention.

Turning now to FIG. 3, a block diagram of a system 300 that includes a distributed memory buffer 316 is generally shown in accordance with one or more embodiments of the present invention. The distributed memory buffer 316 shown in FIG. 3 includes dynamic random access memories (DRAMS) 310, register clock drivers (RCDs) 308, data chips (DCs) 306, and an address/command chip (AC) 304. Each of the DCs 306 and the AC 304 include a CRC control module 302 for performing all or a subset of the CRC processing described herein. The logic in the CRC control modules 302 can vary based on different requirements (e.g., frame isolation, lane isolation) and different physical and/or logic differences between the channels. For example, at a given point in time, the logic in the CRC control module 302 located on the AC 304 can be different than the logic in the CRC control module 302 located on one or more of the DCs 306. Also, at a given point in time, the logic in the CRC control module 302 located on one DC 306 can be different than the logic in the CRC control module 302 located on another of the DCs 306. The CRC control module 302 may also include one or more registers for storing CRC related data such as, but not limited to, CRC rate and an identifier of a CRC type currently being used. Logic (e.g., CRC control module 302) to perform a CRC check and logic to modify the CRC (e.g., rate or type) as described herein are located in and/or executed by both the distributed memory buffer 316 and the host computer 326.

FIG. 3 includes an address/control channel 324 that uses CRC 320 for error detection. The address/control channel 324 is used to transmit address and control information between address/control ports on the distributed memory buffer 316 and address/control data ports 314 on the host computer 326. The address/control channel 324 is also used to transmit responses from the AC 304 to the host computer 326, with CRC included on the return path. Also shown in FIG. 3 are several data channels 322 that use CRC 318 for error detection, the data channels 322 are used to transmit data between the data ports on the distributed memory buffer 316 and data ports 312 on the host computer 326. In accordance with one or more embodiments of the present invention, at any given point in time different CRC rates and types of CRCs may be used on all or a subset of the data channels 322 and address/control channel 324. Pairs of CRC control modules 302 (one on the distributed memory buffer 316 and the other on the host computer 326) can be used to synchronize, or coordinate, CRC rates and types across each of the channels 322 324. In an embodiment each of the data channels 322 is four lanes and the address/control channel 324 is eight lanes.

In accordance with one or more embodiments of the present invention, the address/control channel 324 and the data channels 322 are implemented by a high speed serializer/deserializer (HSS) channel that transports frames of data in both directions. As shown in the embodiment of FIG. 3, the distributed memory buffer structure includes command and address interfaces with the AC 304, and data busses interfacing with a plurality of DCs 306.

In accordance with one or more embodiments of the present invention, the data channels 322 connected to the DCs 306 can contain as few as one or two data lanes. In this case, lane isolation is much simpler and potentially already taken care of by the error code correction (ECC) protection that accompanies the data. In the distributed memory buffer structure shown in FIG. 3, the frames interfacing with the AC 304 may require CRC protection while CRC protection might be optional for the frames containing data bits interfacing with the DCs 306. In addition, this type of structure may produce frames with only eight or sixteen bits available to use as CRC bits, which can be sufficient to protect against a reasonably sized stream of contiguous payload-only frames. One or more embodiments of the present invention provide the flexibility to adapt to any structure and to allow a system policy to customize the rate of CRC versus payload as well as whether to employ frame based CRC checking, lane isolation CRC checking, or any combination therein.

Figure 4:
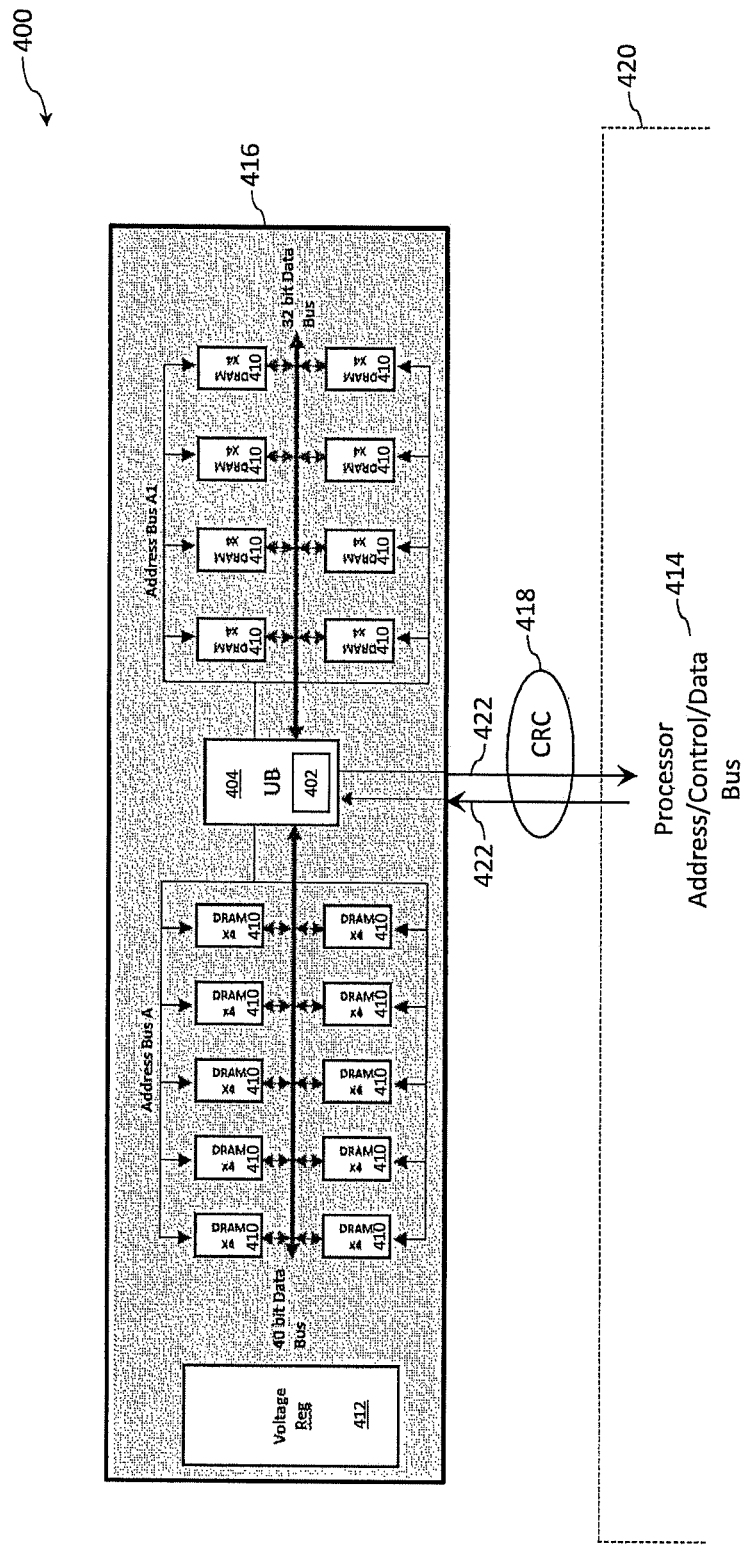
FIG. 4 depicts a block diagram of a system that includes a unified memory buffer in accordance with one or more embodiments of the present invention.

Turning now to FIG. 4, a block diagram of a memory system 400 that includes a memory subsystem 416 with a unified memory buffer 404 is generally shown in accordance with one or more embodiments of the present invention. The memory subsystem 416 shown in FIG. 4 includes DRAMS 410, a voltage regulator 412, and a unified memory buffer 404. The unified memory buffer 404 shown in FIG. 4 includes a CRC control module 402 for performing all or a subset of the CRC processing described herein. The CRC control module 402 may also include one or more registers for storing CRC related data such as, but not limited to, CRC rate and an identifier of a CRC currently being used. Logic (e.g., CRC control module 402) to perform a CRC check and logic to modify the CRC (e.g., rate or type) as described herein are located in and/or executed by both the memory subsystem 416 and processor 420. FIG. 4 includes a bi-directional interface address/control/data channel 422 that uses CRC 418 for error detection. In an embodiment, address/control/data channel 422 is implemented as two unidirectional buses (one bus in each direction, each bus checked with CRC). In an embodiment address/control/data channel 422 is implements as a bi-directional bus, with CRC checking in each direction. The address/control/data channel 422 is used to transmit address and control information between the unified memory buffer 404 and an address/control/data bus 414 on the processor 420 (e.g., host computer or memory controller). A pair of CRC control modules 402 (one on the unified memory buffer 404 and the other on the processor 420 can be used to synchronize, or coordinate, CRC rates and types across the address/control/data channel 422. In an embodiment of the present invention, the address/control/data channel 422 includes eight lanes in each direction with the data and address/control lanes combined. In the memory subsystem 416 shown in FIG. 4, CRC protection may be required for all of the frames of data bits.

In an embodiment, frames to be transmitted can be arranged in an eight-bit by eight-bit matrix in a system where eight high-speed lanes each convey eight beats of information down a channel. Thus, in this example each frame transmission is capable of sending a maximum of sixty-four bits of payload. If the payload is made up of sixty-four bytes of data, then eight such frames would need to be transferred. If the channel is running in a high performance application at, for example, ten Gigabits per second (Gbps), then the sixty-four bytes would be transmitted in 6.4 nanoseconds (ns). However, the payload as described would be unprotected and exposed to error. A common protection scheme includes embedding some number of CRC bits in each frame. For example, an eleven bit CRC can provide the ability to detect most types of errors on any of the eight lanes however, the addition of CRC bits reduces the payload space to fifty-three bits in each packet. The addition of eleven CRC bits requires an additional two frames to deliver all sixty-four bytes, which increases the delivery time of that same data from 6.4 ns to 8 ns. Improved error rate detection and error isolation is possible by using more robust CRC codes which can consume thirty or more bits per frame which would cut the data bandwidth almost in half.

Figure 5:
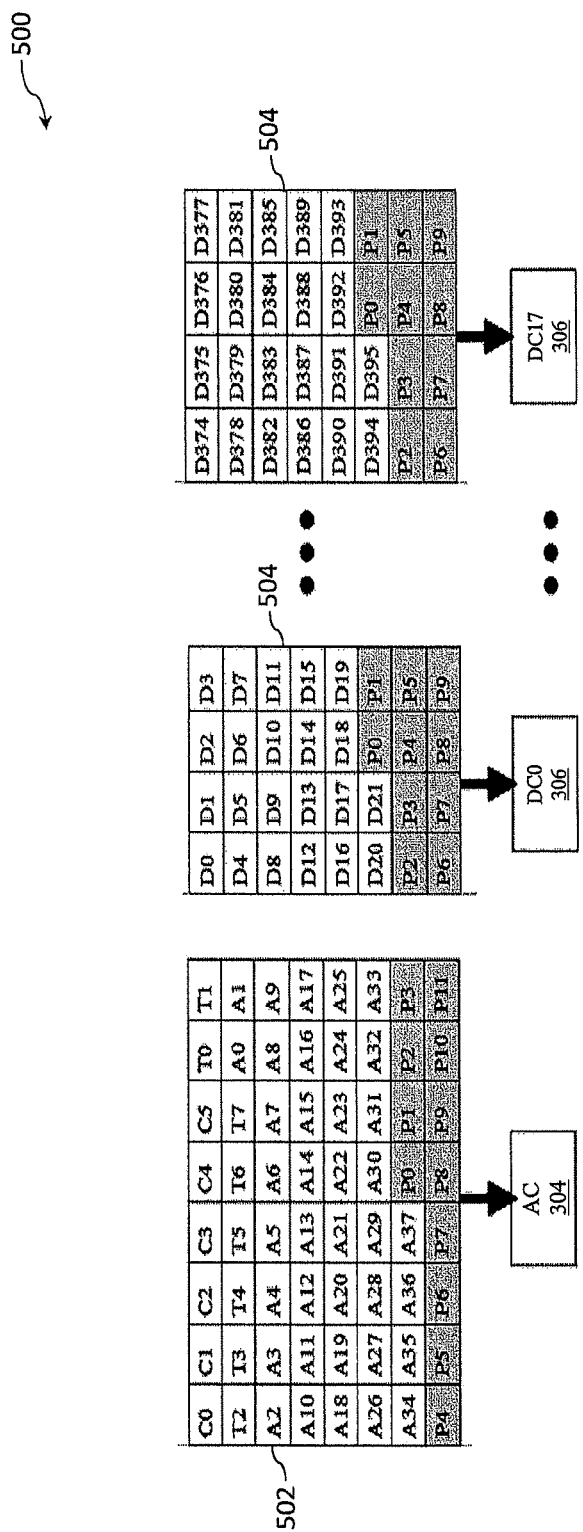
FIG. 5 depicts a distributed memory buffer structure that implements cyclic redundancy (CRC) protected eight beat frames in accordance with one or more embodiments of the present invention.

Turning now to FIG. 5, a distributed memory buffer structure 500 that implements CRC protected eight beat frames is generally shown in accordance with one or more embodiments of the present invention. The distributed memory buffer structure 500 shown in FIG. 5 includes an address/command buffer 502 that is eight bits wide and has eight rows (beats), and that interfaces to an AC, such as AC 304 in FIG. 3. The address/command buffer 502 shown in FIG. 5 includes six command bits (labeled C0-C5), eight response bits (labeled T0-T7), thirty-eight address bits (labeled A0-A37) and twelve CRC bits (labeled P0-P11). The distributed memory buffer structure 500 shown in FIG. 5 also includes eighteen data buffers 504 that each are four bits wide and have eight rows (beats), and that interface to DCs, such as DCs 306 in FIG. 3. The data buffers 504 shown in FIG. 5 each include twenty-two data bits (labeled D0-D21 and D374-D396), and ten CRC bits (labeled P0-P9). The CRC bits shown in FIG. 5 consume space in the frames that could be used for additional command, address, response, and/or data payload bits.

Figure 6:
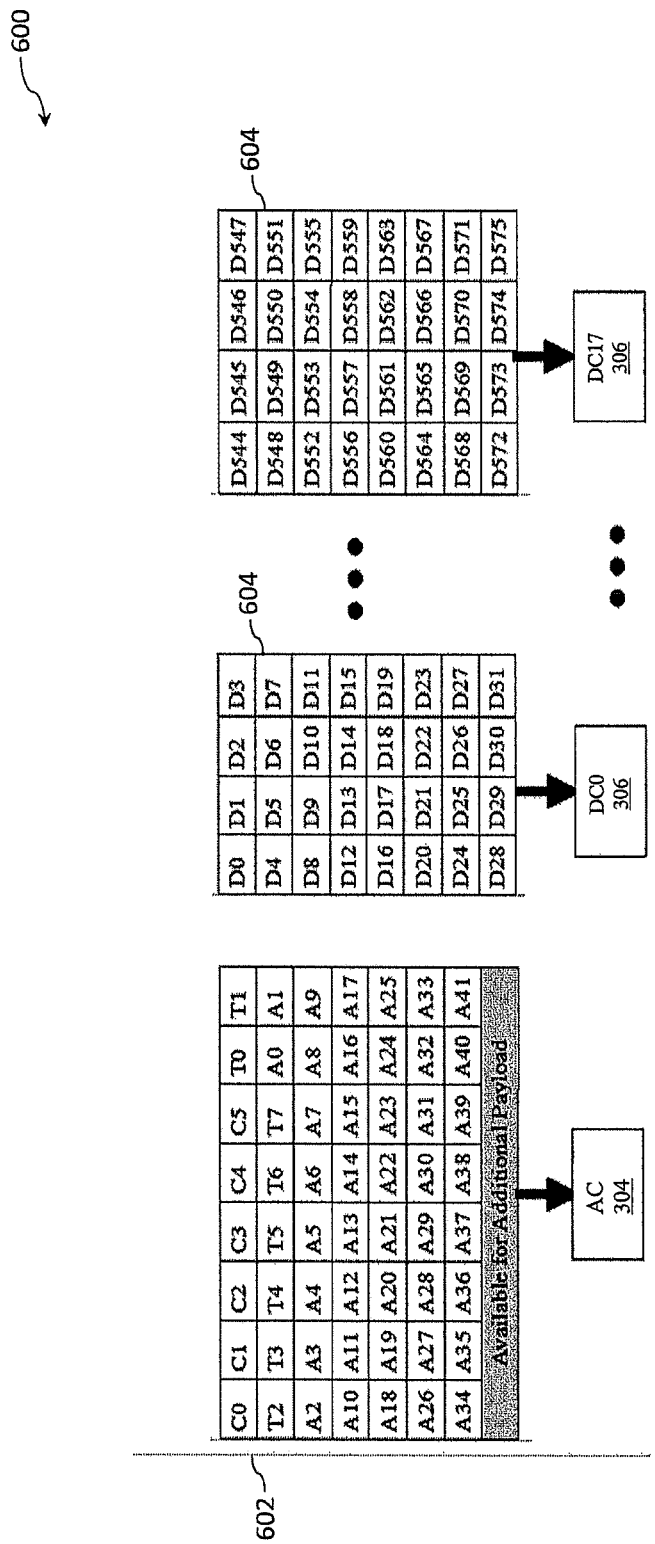
FIG. 6 depicts a distributed memory buffer structure that implements payload only frames in accordance with one or more embodiments of the present invention.

Turning now to FIG. 6, a distributed memory buffer structure 600 that implements payload only eight beat frames is generally shown in accordance with one or more embodiments of the present invention. The distributed memory buffer structure 600 shown in FIG. 6 includes an address/command buffer 602 that is eight bits wide and has eight rows (beats), and that interfaces to an AC, such as AC 304 in FIG. 3. The address/command buffer 602 shown in FIG. 5 includes six command bits (labeled C0-C5), eight response bits (labeled T0-T7), forty-two address bits (labeled A0-A41) and eight bits available for additional payload. The distributed memory buffer structure 600 shown in FIG. 6 also includes eighteen data buffers 604 that each are four bits wide and have eight rows (beats), and that interface to DCs, such as DCs 306 in FIG. 3. The data buffers 604 shown in FIG. 6 each include thirty-two data bits (labeled D0-D31 and D544-D575). The distributed memory buffer structure 600 shown in FIG. 6 does not include any CRC bits. This can result in more payload bits being sent. For example, as shown in FIG. 6, five-hundred and seventy-six data bits can be transferred in the same number of frames as the three-hundred and ninety-six data bits shown in the distributed memory buffer structure 500 of FIG. 5.

In accordance with one or more embodiments of the present invention, upon initializing the communication channel between a transmitter and a receiver, the interface may be programmed with an eight to one ratio, meaning that eight payload-only frames can be transmitted before sending a ninth frame that includes CRC bits. During the initialization process, a common reference point can be established as the basis for counting frames. As long as the communication channel remains error free, this allows sixty-four bytes of data to be transmitted in the minimum required time using an eight-by-eight frame. Referring to the aforementioned eight-by-eight frame structure, this would allow for a sixty-four bit CRC to occupy the ninth frame. Such a code can be extremely robust, providing protection for up to thirteen bit errors, any odd error pattern, and any burst of errors shorter than sixty-four. The probability of failing to detect any other type of random event data error pattern can be about $\frac{1}{2}^{63}$.

This exemplifies the potential for allowing high bandwidth bursts of data or transactions while still permitting enterprise level RAS protection.

Figure 7:
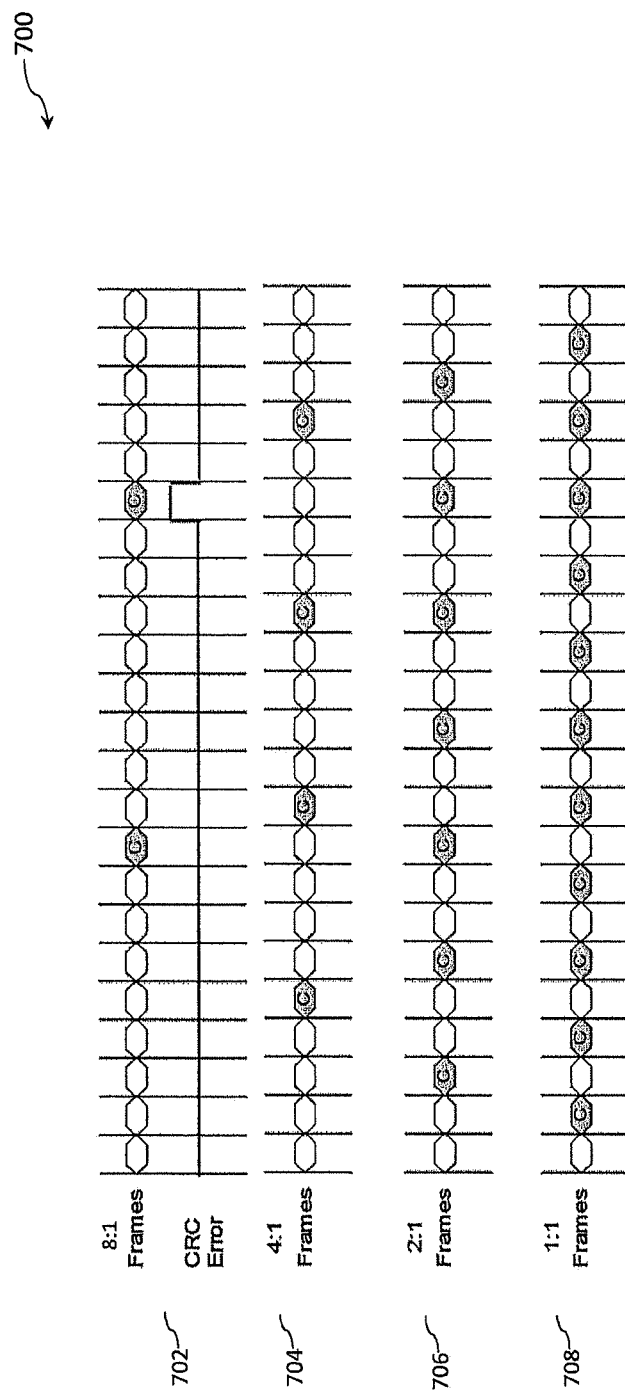
FIG. 7 depicts a timing diagram of a dynamically adjustable CRC rate in accordance with one or more embodiments of the present invention.

Turning now to FIG. 7, a timing diagram 700 of a dynamically adjustable CRC rate is generally shown in accordance with one or more embodiments of the present invention. Exemplary embodiments of the present invention provide CRC timing options outside of the typical three inflexible design points of maximum performance (no CRC checking), maximum RAS (CRC checking on every transmission), and a fixed arbitrary compromise (always check every "X" number of fames). One or more embodiments of the present invention provide for dynamic adjustment between the two extremes of CRC checking on every transmission and no CRC checking based on an error rate currently observed during system operation. Dynamic balancing of RAS and performance is performed based on real-time BER feedback. In addition, different system topologies can adapt to different solutions and even systems within a given topology can have unique solutions. For example, a normally stable system topology could be experiencing an unusually high BER on one particular system, and the CRC rate can be increased on the system dynamically while it is experiencing a high BER. The CRC rate can be decreased as more time passes since a last error (or a specified number of errors) was detected.

Timing diagram 702 shows an example of a multi-frame CRC that implements an eight to one payload to CRC ratio which can be implemented by one or more embodiments of the present invention. As shown in FIG. 7, frames labeled "C" contain one or more CRC bits. As shown in the timing diagram 702, a CRC error is detected by the second CRC check. Upon detection of the CRC error, CRC control logic (e.g., CRC control module 302) can be used to perform BER analysis and to dynamically change to a new ratio. Depending on implementation and application factors a four to one ratio such as that shown in timing diagram 704 can be applied, or a two to one ratio such as that shown in timing diagram 706 can be applied, or a maximum RAS that includes a one to one ratio such as that shown in timing diagram 708 can be applied. Different types of interface and different memory channels can enact different policies. Thus, a command/address interface on a communication bus can have a different policy (e.g. CRC ratio) than a data interface on a communication bus.

One or more embodiment of the present invention works in conjunction with positive acknowledge protocols such that anytime a frame is CRC checked, an acknowledge is returned in the opposite direction. This provides continuous feedback to the transmitting side which allows for more efficient use of retry or replay resources which must be allocated to retransmit bad frame sequences. For example, in the absence of an acknowledge, even if the receiving side checks the CRC after every eight payload-only frames, the transmitting side needs to hold on to any subsequent frames until it knows that the time for an error response has passed. If an asynchronous error indication mechanism is used, it can be many more frames of time for the response to reach the transmitter. However, an acknowledge based protocol ensures a guaranteed receipt of an acknowledge within a fixed time, thereby allowing the transmitting side to free up its resources. This concept also pertains to idle frames which are considered payload, so even if a stream of idle frames is being transmitted, the positive acknowledge after the CRC checking allows for potential resource to free up.

One or more embodiments of the present invention include a pliable CRC code that takes on different configurations depending on the physical topology of the interface. For example, an interface may include "N" lanes where not all of them are in use at all times. A subset might be dynamically disabled to save power if transactions can be conveyed that don't require them. At a later time the system may begin servicing operations which require all N lanes thereby powering or enabling them. One or more embodiments of the present invention seek to accommodate such a flexible interface by allowing for dynamic reconfiguration of the CRC code to appropriately cover all N lanes or just a subset of the N lanes. Since covering fewer lanes can translate into requiring fewer CRC bits, it presents an opportunity to select a more efficient code that saves CRC space and provides for more payload bits (thereby improving overall bandwidth).

In accordance with one or more embodiments, the control of the dynamic CRC adjustment can be always sourced from the same host (regardless of which interface direction is experiencing the problem), or it can be driver side based. In other words, if the system policy prefers, it could always be the host (e.g., memory controller) that determines when to switch the CRC ratio and/or type of CRCs and also the host that enacts the recovery process, regardless of whether the error occurred on the downstream channel from the host to the memory subsystem or on the upstream channel from the memory subsystem to the host. In this embodiment, the memory subsystem can always be told to either update its receiving CRC checking circuitry in response to downstream errors, or to update its CRC generation circuitry in response to upstream errors. An alternate embodiment of the present invention allows for the driving side of each interface to always determine whether an update is necessary and to enact the recovery process to receiving side. By allowing either means of adjustment, disparate elements communicating via an open standard protocol can apply one or more embodiments of the present invention.

Figure 8:
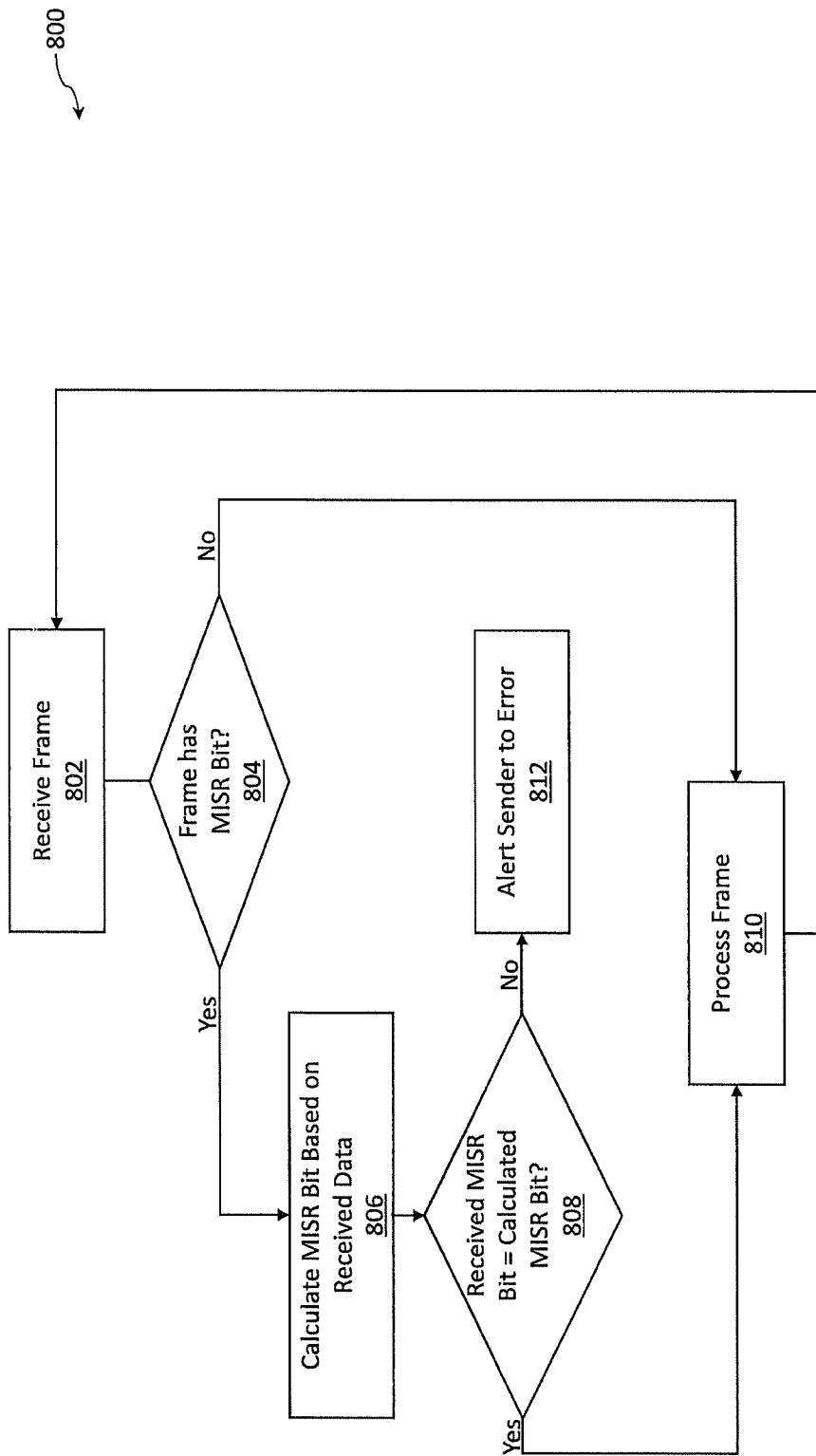
FIG. 8 depicts a flow diagram of using a CRC multiple-input shift register (MISR) to provide early warning and fail detection in accordance with one or more embodiments of the present invention.

Turning now to FIG. 8, a flow diagram 800 of using a CRC MISR to provide early warning and fail detection is generally shown in accordance with one or more embodiments of the present invention. At block 802, a frame from a transmitter is received by a receiver. At block 804 it is determined whether the frame includes a CRC MISR bit (also referred to herein as a "source single check bit"). If the frame does not include a CRC MISR bit, then processing continues at block 810 where the frame is processed in a typical manner which can include, for example, removing CRC bits from the frame, performing a multi-frame CRC check and/or generating partial CRC bits for a future multi-frame CRC check. If it is determined at block 804 that the frame does include a CRC MISR bit, then processing continues at block 806 where a CRC MISR bit is calculated based on bits in frames received by the receiver since a last CRC check. In accordance with one or more embodiments of the present invention, the CRC MISR bit is calculated by a MISR based on partial CRC bits generated by the CRC compressor. The received, or expected, CRC MISR bit is compared to the calculated, or actual, CRC MISR bit at block 808. If the received and the actual CRC MISR bits are the same, then processing continues at block 810. If it is determined at block 808 that the received and actual CRC MISR bits are not the same, then block 812 is performed and an alert of a possible CRC error is sent to the transmitter.

In accordance with one or more embodiments of the present invention, in response to receiving the alert at block 812, the sender can record the alert and take no further action. Once more than a selected number of alerts are received, the sender can initiate a recovery sequence. In accordance with one or more embodiments of the present invention, in response to receiving the alert at block 812, the sender can initiate a CRC check at the receiver by entering a recovery state. Alternatively, the transmitter can send a frame that includes CRC bits generated by the transmitter based on frames received since the last CRC check and request the receiver to perform a CRC check using the transmitted bits. Based on the results of the forced CRC check, a recovery sequence can be initiated to take actions such as, but not limited to: adjust the CRC rate, apply a different type of CRC, adjust the MISR rate, and/or change the MISR calculation.

Figure 9:
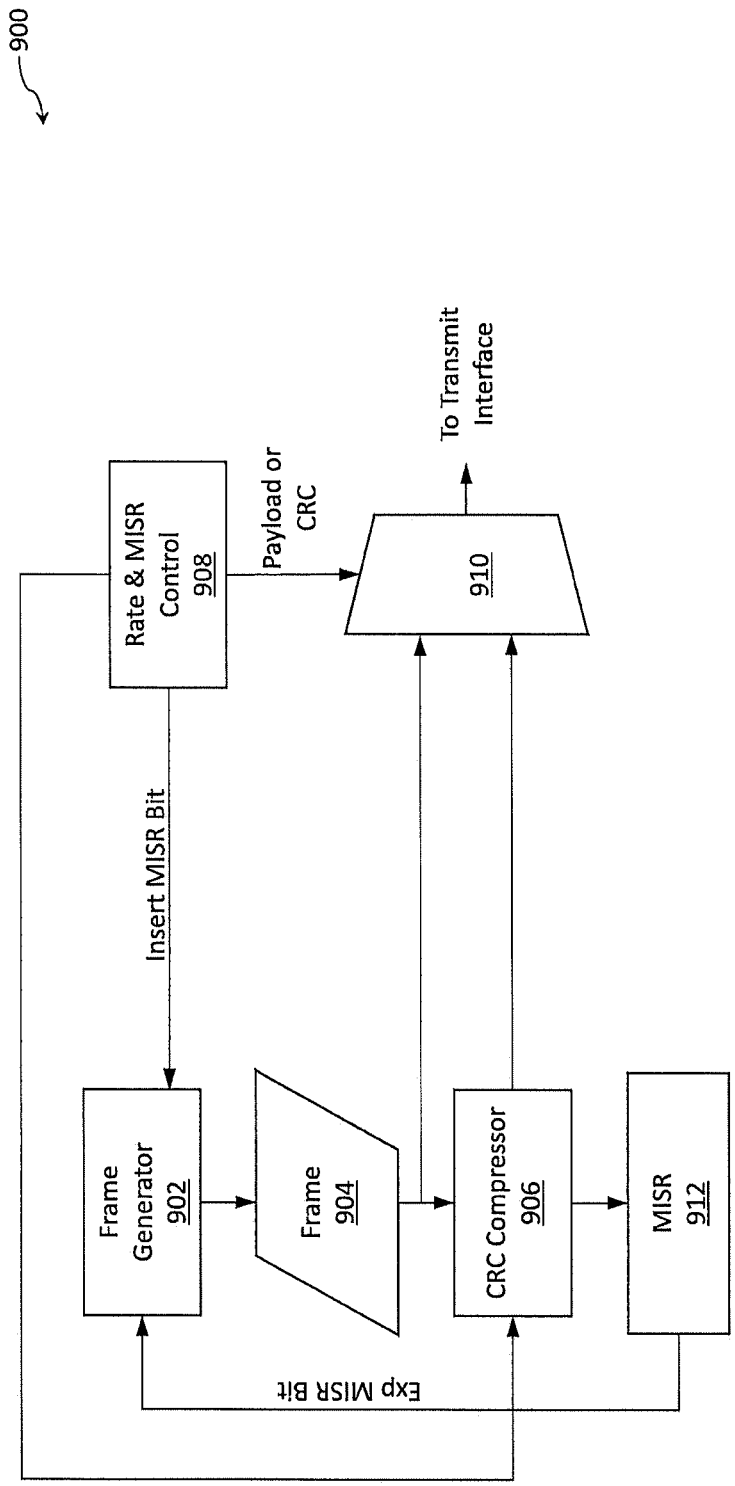
FIG. 9 depicts a flow diagram of CRC transmit circuitry in accordance with one or more embodiments of the present invention.

Turning now to FIG. 9, a flow diagram 900 of CRC transmit circuitry is generally shown in accordance with one or more embodiments of the present invention. The processing shown in FIG. 9 can be performed by CRC control circuitry such as CRC control module 302 in FIG. 3 or CRC control module 402 in FIG. 4. The frame generator 902 creates payload content of a frame 904 to be transmitted across a communication channel. The rate and MISR control 908 determines the CRC rate, or how often to interject CRC bits into a frame before it is transmitted to a receiver. The rate and MISR control 908 also determines how often to interject a check bit into a frame before it is transmitted to the receiver.

The CRC compressor 906 determines the type of multi-frame CRC to be applied to the payload bits in the frame 904 and it keeps track of what data bits to include when generating the CRC bits. The CRC compressor 906 calculates the CRC bits for each frame and combines them with previously calculated CRC bits for previous frames. In accordance with one or more embodiments of the present invention, at any given point in time, the CRC compressor 906 stores CRC bits that are generated based on the payload bits in the frames received since the last CRC check was performed. These CRC bits, which change with each additional frame that is processed by the CRC compressor 906 are referred to herein as partial CRC bits. A CRC check can be performed on the payload bits in the frames received since the last CRC check using the corresponding partial CRC bits.

After each frame 904 is processed by the CRC compressor 906, the partial CRC bits are output to a MISR 912 which generates a single check bit, a source single check bit, based on the partial CRC bits. Any manner of compressing the partial CRC bits into a single bit can be implemented by exemplary embodiments of the present invention. For example, the MISR 912 can perform an exclusive or (XOR) on the partial CRC bits and output the result as a check bit. In another example, the MISR 912 outputs a parity of the partial CRC bits as the check bit. The check bit, shown in FIG. 9 as "EXP_MISR_BIT" is added to the frame by the frame generator 902 before the frame is transmitted to the receiver.

The rate and MISR control 908 is in communication with the CRC compressor 906 to coordinate the resetting of the CRC and/or other controls, calculations, frame decodes, etc. The CRC bits are input to multiplexor 910 which adds them into a frame for transmission to a receiver across a communication channel when the rate control 908 indicates that the CRC bits should be added (e.g., the PAYLOAD_OR_CRC signal indicates CRC). Otherwise, the multiplexor 910 transmits a frame containing payload data only to the transmission interface for transmission across a communication channel to a receiver.

The rate and MISR control 908 also controls how often a check bit is added to a frame. For example, the check bit can be added in every frame, or in every other frame, or in every tenth frame, etc. In accordance with one or more embodiments of the present invention, the check bit rate can be modified in parallel with functional operations of the receiver or transmitter in a manner similar to that described herein with respect to the CRC rate.

Figure 10:
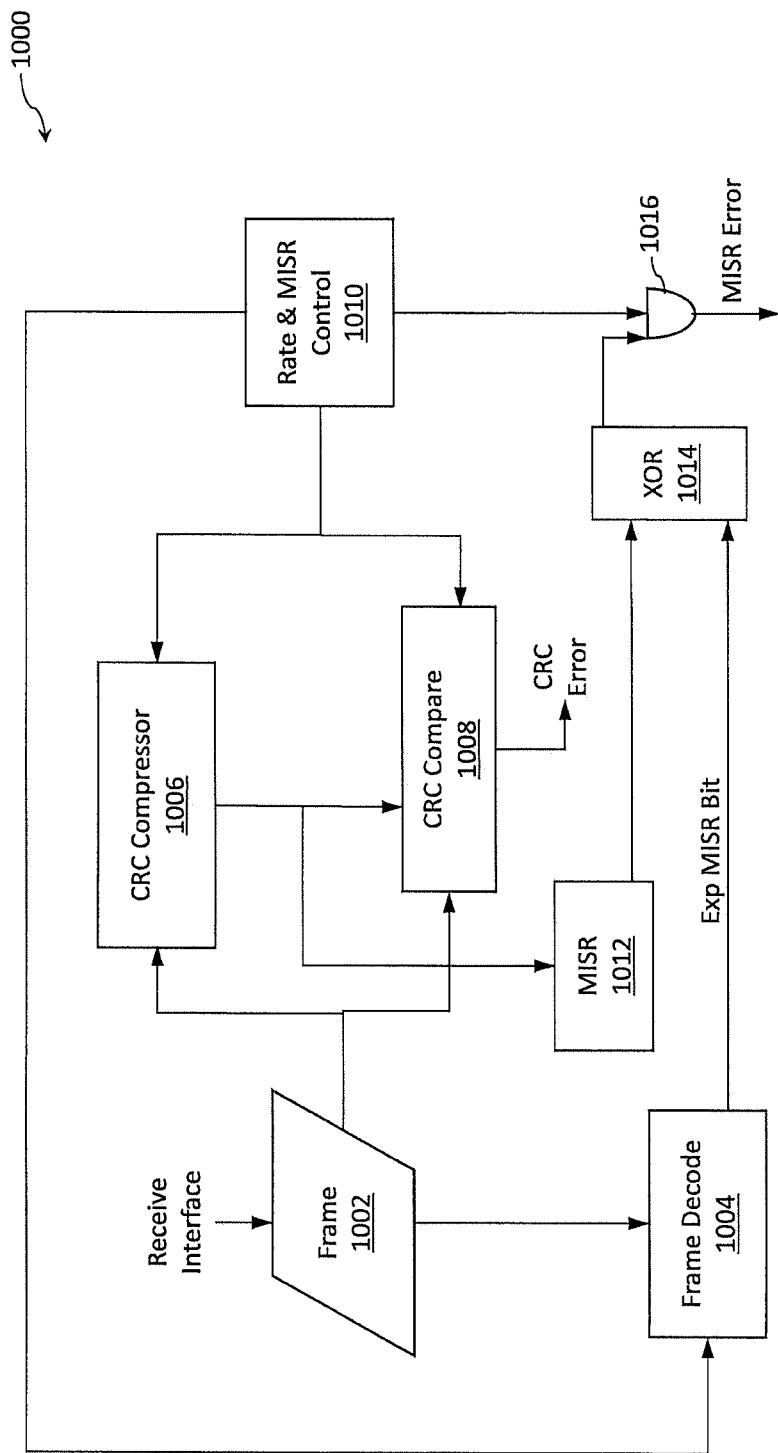
FIG. 10 depicts a flow diagram of CRC receive circuitry in accordance with one or more embodiments of the present invention.

Turning now to FIG. 10, a flow diagram 1000 of CRC receive circuitry is generally shown in accordance with one or more embodiments of the present invention. The processing shown in FIG. 10 can be performed by CRC control circuitry such as CRC control module 302 in FIG. 3 or CRC control module 402 in FIG. 4. A frame 1002 is received at an interface on a receiver and sent to frame decode 1004 where the CRC bits or check bit, if any, are extracted and the payload is ready for use by the receiver. The rate and MISR control 1010 keeps track of which of the incoming frames 1002 have CRC bits or a check bit, and the CRC compressor 1006 keeps track of the type of multi-frame CRC currently in use. The rate and MISR control 1010 communicates with the frame decode 1004 to indicate, for example, whether a new frame has CRC bits or a check bit or just payload bits.

The frame payload is sent to CRC compressor 1006 where a CRC is generated based on payload bits in the frame 1002 and payload bits in previous frames received since the last CRC check was performed. When the frame 1002 contains CRC bits, the CRC bits are extracted from the frame 1002 and used by the CRC compare 1008 to compare the calculated (actual) CRC bits with the extracted (expected) CRC bits. If the expected CRC bits are not the same as the calculated CRC bits, then an error signal, shown in FIG. 10 as "CRC_ERROR", is output. When the frame 1002 contains a check bit (the expected check bit), it is extracted by the frame decode 1004, shown in FIG. 10 as "EXP_MISR_BIT", and input to XOR logic 1014. In addition, when the rate and MISR control 1010 indicates that the frame 1002 contains a check bit, the partial CRC bits in the CRC compressor 1006 are used by the MISR 1012 to calculate a check bit (the actual check bit) which is input to the XOR logic 1014. If the expected check bit does not match the calculated check bit as determined by multiplexor logic 1016, an error indication, shown in FIG. 10 as "MISR_ERROR", is output. In accordance with one or more embodiments, the MISR_ERROR signal is sent to the transmitter to indicate a possible error in the transmission of the payload.

In accordance with one or more embodiments described herein, the CRC rate as modified by rate control logic (e.g., rate and MISR control 908, rate and MISR control 1010) can be fixed or programmable. In addition, the type of CRC being utilized as modified by the CRC compressor logic (e.g., CRC compressor 906, CRC compressor 1006 can also be fixed or programmable. This can allow for at least three cases: variable rate CRC using a fixed CRC code; fixed rate CRC using an adjustable CRC code; and variable rate CRC using an adjustable CRC code. Each of these three cases can include the use of a CRC MISR bit as described herein.

In accordance with one or more embodiments of the present invention, if CRC errors are detected, the interface between the receiver and transmitter (e.g., via a CRC control module) can enter a recovery sequence which may culminate with the re-programming of the payload bit to CRC bit ratio to implement a higher CRC rate. For example a system policy could determine that after a certain BER, the ratio of eight payload frames to one CRC frame should be changed to four payload frames to one CRC frame, to two payload frames to one CRC frame, or to zero payload frames to one CRC fame (meaning each frame would require embedded CRC). In addition, or alternatively, the recovery sequence may culminate with the re-programming of the payload bit to CRC MISR bit ratio to implement a higher (or lower) CRC MISR bit rate. In accordance with one or more embodiments of the present invention, the recovery sequence includes a handshaking protocol to allow both sides of the interface to dynamically change the CRC and/or CRC MISR bit protection ratio while the channel is still operational. In the case of a memory subsystem, the memory buffer can include an autonomous memory controller responsible for queuing and scheduling operations on behalf of the host. In the event that the BER threshold is exceeded while memory operations are in flight, the CRC ratio can be dynamically altered during functional operation without the need to shut down or re-initialize the memory channel.

Figure 11:
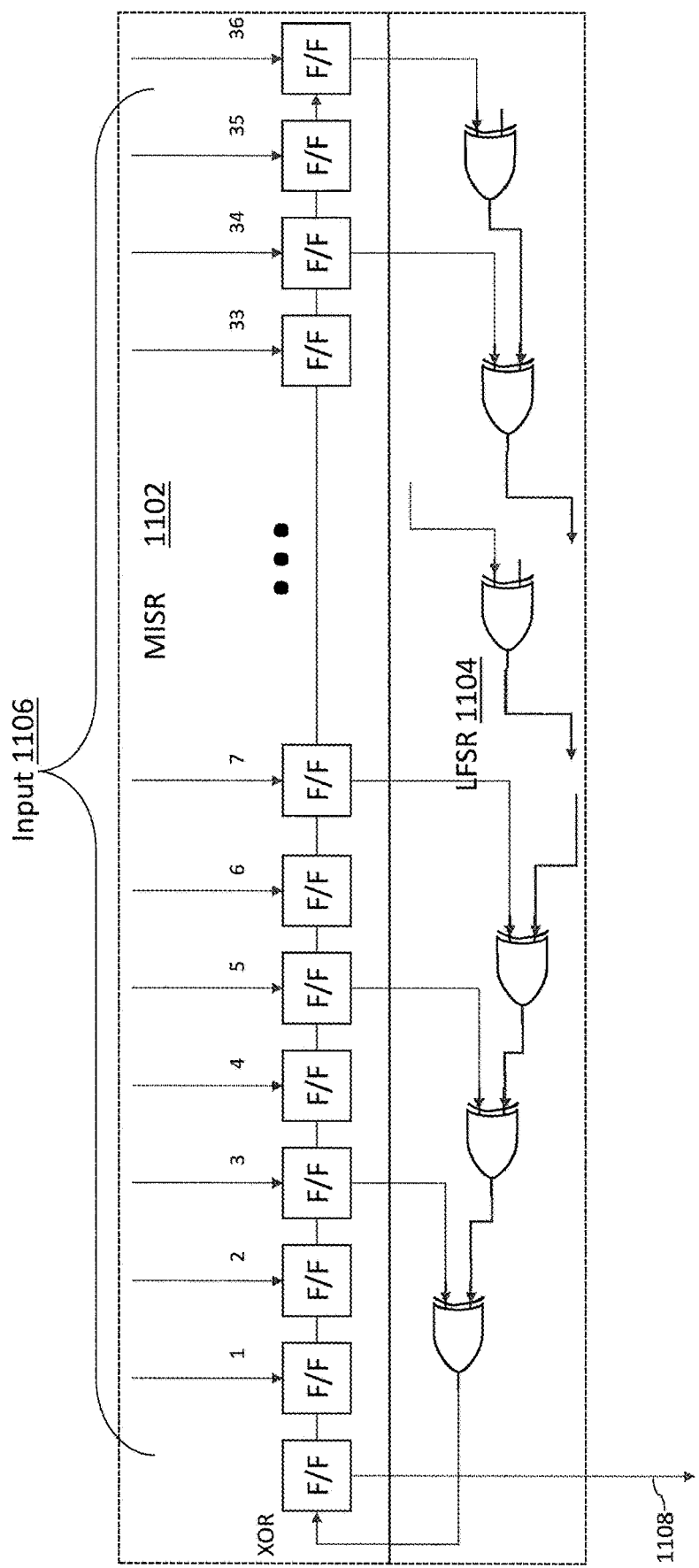
FIG. 11 depicts a MISR coupled with a linear-feedback shift register (LFSR) to compress a CRC signature in accordance with one or more embodiments of the present invention.

Turning now to FIG. 11, a circuit diagram 1100 of a MISR 1102 coupled with a linear-feedback shift register (LFSR) 1104 to compress a CRC signature is generally shown in accordance with one or more embodiments of the present invention. In the embodiment shown in FIG. 11, the length of the MISR 1102 is 37 (bits 1-36 plus an additional bit 0 to contain a LFSR status summary bit). The length of the MISR can vary based on implementation requirements and CRC lengths and types, and embodiments are not limited to MISRs of particular lengths. The MISR 1102 shown in FIG. 11 is constructed with flip-flops to compress the input received on the input bus 1106. The LFSR 1104 shown in FIG. 11 includes exclusive-or (XOR) circuitry for implementing a polynomial with terms X^3, 5, 7, 13, 14, 15, 16, 19, 23, 28, 34, 36 (shorthand for X^3+X^5+X^7+ ... ). The type of LFSR can vary based on implementation requirements and embodiments are not limited to LFSRs implementing particular polynomials nor are they limited to prime polynomials.

In accordance with one or more embodiments of the present invention, the input on the input bus 1106 contains, on each cycle, the 36-bit CRC pattern from a current frame. Each bit of the input is XORed with the prior MISR bit to determine the state of the next MISR bit. For example, MISR bit 5, on the subsequent cycle after a clock is supplied, contains the XOR of the input to bit 5 with the output of MISR bit 4 (from the current cycle). In an embodiment, the MISR 1102 is constructed with a linear polynomial to create CRC bits. As shown in FIG. 11, the particular MISR bits are fed back into the LFSR 1104 which implements a second linear polynomial not related and relatively prime from the first polynomial in the case where there is also a CRC polynomial.

In an embodiment, there is a MISR 1102/LFSR 1104 on the driver as well as the receiver side of the interface. For convenience, the term "MISR" as used herein refers to both the MISR 1102 and LFSR 1104 circuitry shown in FIG. 11. The generated CRC from the driver is sent into the driver MISR logic to update the driver MISR. Bit zero of the driver MISR is available every cycle to be output 1108 and sent to the receiver. Likewise, the generated CRC from the received frame data is sent into the receiver MISR logic to update the driver MISR. Bit zero of this receiver MISR is available every cycle to be compared to the bit zero that was sent by the driver to determine if there is a mis-compare between the two compressed CRC streams.

In an embodiment of the present invention, raw data is used instead of CRC codes as input to the MISR input bus 1106. In an embodiment, the bit zero MISR mis-compare (e.g., a compare when the bit zero from the receiver and driver don't match) triggers sending the CRC at an earlier time than normally planned. In an embodiment, the bit zero MISR mis-compare triggers a recovery action, including the resending of data across the interface (e.g., the communication channel).

An example of how the MISR works is shown in Table 1 below.

TABLE 1

| CYCLE | MISR[0, 1:36] | INPUT[1:36] | LFSR |
|---|---|---|---|
| 1 | 0_000000000000000000 ... | 000000000000000000 ... | 0 |
| 2 | 0_000000000000000000 ... | 000100000000000000 ... | 0 |
| 3 | 0_000100000000000000 ... | 000000000000000000 ... | 0 |
| 4 | 0_000010000000000000 ... | 000000000000000000 ... | 1 |
| 5 | 1_000001000000000000 ... | 000000000000000000 ... | 0 |

For ease of explanation, the MISR shown in Table 1 is all zeros at cycle 1. Notice that only the first eighteen 18 bits of the MISR and INPUT are shown (the rest are zero for this illustration). It is assumed in this example that the CRC (and/or frame data) that enters the driver MISR via the input bus 1106 is always zero on the driver side of the interface. For an interface that does not have errors, the same CRC (and/or frame data) enters the receiver MISR via the input bus 1106, with the same values (i.e. all zero, in this example). Since the MISR input and LFSR are all zero in cycle 1, the value of MISR on cycle 1 will be all zero. The MISR is shown as a leading "bit 0" register followed by MISR bits 1-36 (using big endian nomenclature). For the driver side, it is assumed that the input will remain at zero, thus yielding MISR bit 0 ("MISR[0]") having the value of zero continuously, without error, indefinitely. Thus, the MISR bit 0 that gets sent to the receiver will be zero every frame/cycle.

Looking at the receiver side, if there are no errors, the input to the receiver MISR via the input bus 1106 (either being CRC per cycle or raw data) is identical to the data that was sent to the driver MISR (i.e., all zeros in this example). So, MISR[0] will also be zero on every cycle. The comparison of the received MISR[0] from the driver versus the calculated MISR[0] on the receiver will match (i.e. zero on every cycle).

In the case where there is an error and there is, for example, an erroneous bit in the receiver input on cycle 1 (shown as bit 4 of the INPUT[1:36] bus in Table 1). The bit in error is a one rather than a zero. As shown in Table 1, on cycle 3, the MISR takes on the value of "0_000100000000000000000000000000000000" based on the XOR at the input of MISR[4]. It should be noted that the leading zero of the MISR is MISR[0], which has no corresponding INPUT data bit and is only affected by the LFSR output from the previous cycle.

As shown in the example in Table 1, on cycle 4, the MISR takes on the value of "0_000010000000000000000000000000000000", based on the shift-right of the MISR combined with the XOR at the input of MISR[5] (with INPUT[5]='0'). In addition, since MISR[5] is part of the LFSR feedback path, the LFSR outputs now have a value of one. As shown in Table 1, in cycle 5, the MISR takes on the value of "1_000001000000000000000000000000000000". MISR[0] takes on the value of the cycle 4 LFSR value (i.e., one). MISR[6] takes on a value of one based on the shift-right of the MISR from MISR[5] combined with the XOR at the input of MISR[6] (with INPUT[6]=zero). On cycle 5, none of the inputs to the LFSR logic are non-zero, thus the LFSR on cycle 5 is back to zero.

Processing continues on the MISR following cycle 5 (not shown in table 1) in a similar manner. Notice that cycle 5 is the first cycle where MISR[0] has a value of one. This is the first cycle of the mismatch of the driving MISR[0] with the receiving MISR[0]. Notice that for this example of INPUT [4] being in error, it took three (5-2) cycles to detect the error at MISR[0].

It should be noted that because XOR logic is used in the LFSR as well as the MISR inputs, that these same behaviors for mis-compare will result regardless of the starting MISR initial value (seed), provided this starting value was consistent on the driver and receiver MISRs on corresponding cycles (i.e., accounting for latency). It should also be noted that any pattern of consistent input data on the driver and receiver that only mis-compare in cycle 2, INPUT[4] (with all other data being equal) will yield the exact same cycle mis-compares of the MISR[0]. In the example shown in Table 1, contents of the input bus 1106 provided the only mismatch between the driving and receiving input bus in cycle 2 at INPUT[4]. Other single-bit examples can be shown to demonstrate similar propagations and delays.

Table 2 below shows the latencies/delays for each single-bit error of INPUT [1-36] in accordance with one or more embodiments of the present invention. It should be noted that the detection delay is directly related to the time it takes for a particular bit to enter the LFSR logic. Thus, the propagation delays between error and detection are a result of the polynomial codes and log used in the generation of the MISR. For this particular LFSR code, the largest delay from INPUT to detection is seven cycles (as shown for bits eight and twenty-nine). Therefore, this example design can be deemed to have a latency of seven cycles.

It should also be noted that those skilled in the art can design many possible variations of this design point, including other LFSR polynomials, MISRs that shift left rather than right, addition of other embedded logic, combined CRC generation and LFSR reduction, etc. These variations can be implemented by exemplary embodiments of the present invention.

TABLE 2

| INPUT BIT # | 1 | 2 | 3 | 4 | 5 | 6 | 7 | 8 | 9 | 10 | 11 | 12 |
|---|---|---|---|---|---|---|---|---|---|---|---|---|
| LATENCY | 4 | 3 | 2 | 3 | 2 | 3 | 2 | 7 | 6 | 5 | 4 | 3 |
| INPUT BIT # | 13 | 14 | 15 | 16 | 17 | 18 | 19 | 20 | 21 | 22 | 23 | 24 |
| LATENCY | 2 | 2 | 2 | 2 | 4 | 3 | 2 | 5 | 4 | 3 | 2 | 6 |
| INPUT BIT # | 25 | 26 | 27 | 28 | 29 | 30 | 31 | 32 | 33 | 34 | 35 | 36 |
| LATENCY | 5 | 4 | 3 | 2 | 7 | 6 | 5 | 4 | 3 | 2 | 3 | 2 |

In accordance with one or more embodiments of the present invention, there is no way for an error on an INPUT[i] bit to, on some later cycle, to 'undo' the effect on MISR[0] such that the first error will not be detected at this earliest latency time. However, there are some multiple-bit failures that can delay the detection of MISR[0]. These cases are very rare. An example of one such case to illustrate the effect on detection is shown below in Table 3.

TABLE 3

| CYCLE | MISR[0, 1:36] | INPUT[1:36] | LFSR |
|---|---|---|---|
| 1 | 0_000000000000000000 . . . | 000000000000000000 . . . | 0 |
| 2 | 0_000000000000000000 . . . | 010100000000000000 . . . | 0 |
| 3 | 0_010100000000000000 . . . | 000000000000000000 . . . | 0 |
| 4 | 0_001010000000000000 . . . | 000000000000000000 . . . | 0 |
| 5 | 0_000101000000000000 . . . | 000000000000000000 . . . | 0 |
| 6 | 0_000010100000000000 . . . | 000000000000000000 . . . | 0 |

TABLE 3-continued

| CYCLE | MISR[0, 1:36] | INPUT[1:36] | LFSR |
|---|---|---|---|
| 7 | 0_000001010000000000 . . . | 000000000000000000 . . . | 0 |
| 8 | 0_000000101000000000 . . . | 000000000000000000 . . . | 1 |
| 9 | 1_000000010100000000 . . . | 000000000000000000 . . . | 0 |

The input pattern shown in Table 3 is identical to that in Table 1 with the exception of that at cycle 2, both INPUT[2] and INPUT[4] both failed. The effect of two errors in the same cycle, based on the LFSR shown in FIG. 11, is that the detection for MISR[0] that showed up on cycle 5 as shown in Table 1 no longer shows up on that cycle. In a sense, bits 2 and 4 cancel each other out when they arrive at the LFSR circuit. However, they do eventually show up at cycle 9. This is because INPUT[2] propagates to MISR[7] on cycle 8 which feeds the LFSR, while INPUT[4] propagates to MISR[9] on cycle 8 which does not feed the LFSR, thus causing MISR[0] to finally reach one on cycle 9 (four cycles later than in the single-bit error). Thus, the latency goes from three cycles (5-2) to seven cycles (9-2). In accordance with one or more embodiments of the present invention, in cases where multiple lanes may fail, more time is given prior to determining whether or not there were errors. Even though there was a delay in the error detection in the example shown in Table 3, using a prime polynomial ensures a high chance of detection because it avoids cases where regular errors at regular error rates on multiple lanes cancel each other out.

Figure 12:
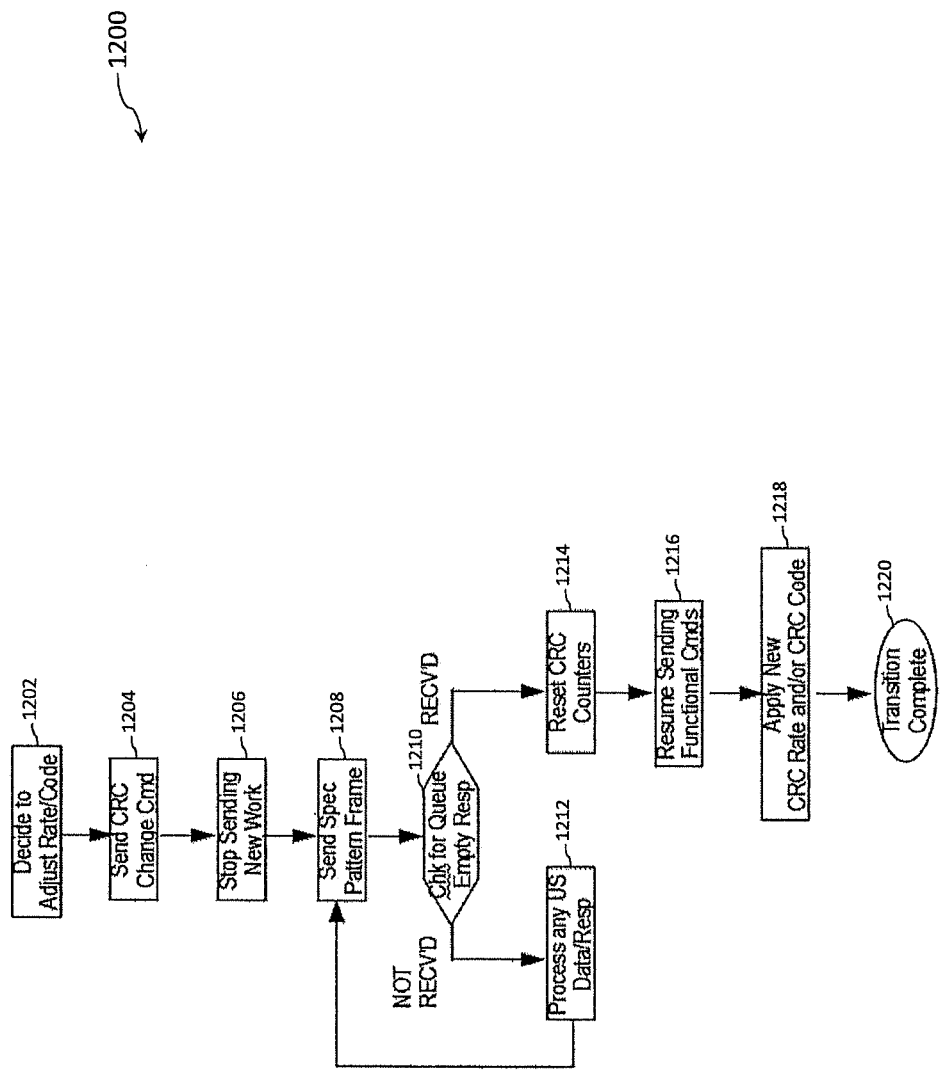
FIG. 12 depicts a flow diagram of a transmit side of adjusting a CRC during run time in accordance with one or more embodiments of the present invention.

Turning now to FIG. 12, a flow diagram 1200 of a transmit side (the "transmitter") of adjusting a CRC during run time is generally shown in accordance with one or more embodiments of the present invention. The processing shown in FIG. 12 can be performed by CRC control circuitry such as CRC control module 302 in FIG. 3 or CRC control module 402 in FIG. 4. At block 1202 a decision is made to adjust the CRC rate and/or the CRC type. At block 1204, a CRC change command is sent to the CRC control circuitry on the receiving side (the "receiver") and at block 1206 the transmit side stops sending new work to the receiver. At block 1208 a frame having a deterministic "special" pattern is sent to the receiver to prevent the receiver from starting a new data transmission. In an embodiment, the "special" pattern is continuously sent until the transaction (e.g., the CRC change) is complete. At block 1210, the logic checks to see if a queue empty response has been received from the receiver. The queue empty response indicates that the queues on the receiving side are empty and that the receiver is at a good processing point to make a transition to a new CRC rate and/or type. If the queue empty response has not been received, then processing continues at bock 1212 where any upstream data/responses are processed. In accordance with one or more embodiments of the present invention, the processing at block 1212 includes performing normal responses to memory read and write operations such as, but not limited: to a read (fetch) alert to indicate requested read data is forthcoming, a write done response to indicate the write operation is complete, and an error indicator. Processing then continues at block 1208.

If the queue empty response has been received, as determined at block 1210, then processing continues at block 1214 where the CRC counters are reset. At block 1216 the sending of functional commands to the receiver is resumed, and at block 1218 the new CRC rate and/or type is applied to the next frame of data to be transmitted. The transition to the new CRC rate and/or type is complete and processing of data transmission across the communication channel continues at block 1220.

In accordance with one or more embodiments of the present invention, one of more of the blocks shown in FIG. 12 may have a handshake with the receive side. For example, block 1204 which sends a CRC change command may require an acknowledgment from the receive side that the CRC change command has been received before going forward with stopping the sending of new work in block 1206.

The CRC changes described above in FIG. 12 can also include a MISR bit rate change and/or a MISR calculation change in addition to or instead of the CRC rate and/or type changes.

Figure 13:
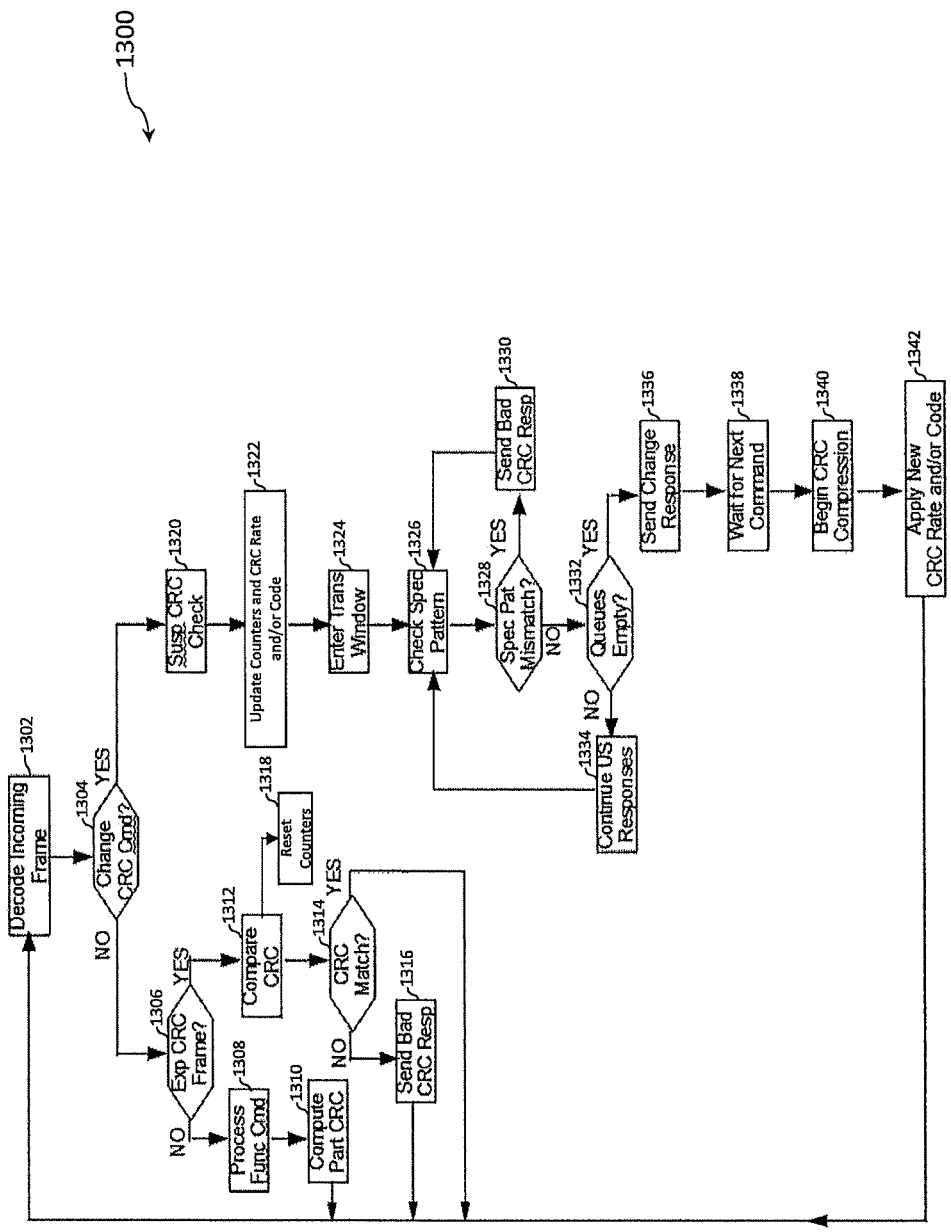
FIG. 13 depicts a flow diagram of a receive side of adjusting a CRC during run time in accordance with one or more embodiments of the present invention.

FIG. 13 depicts a flow diagram 1300 of a receive side of adjusting a CRC during run time in accordance with one or more embodiments of the present invention. The processing shown in FIG. 13 can be performed by CRC control circuitry such as CRC control module 302 in FIG. 3 or CRC control module 402 in FIG. 4. At block 1302, an incoming frame is decoded and at block 1304 it is determined whether the frame contains a change CRC command. If the frame does not contain a change CRC command, then processing continues at block 1306 where it is determined whether the frame contains CRC bits. In an embodiment, a count is kept of the number of frames received and this is compared to a number of payload-only frames between each frame that includes CRC bits to identify frames that contain CRC bits. If the frame contains CRC bits, then processing continues at block 1312 where a CRC calculated based on content of the payload is compared to CRC bits contained in the frame. Processing continues at block 1318 where the CRC counters are reset. Processing also continues from block 1312 to block 1314. If the CRC calculated based on content of the payload matches the CRC bits contained in the frame, as determined at block 1314, then processing continues at block 1302. If the expected CRC bits in the frame do not match the CRC bits calculated based on the payload, as determined at block 1314, then block 1316 is performed and a response indicating a CRC error is sent to the transmitter of the frame. Processing continues at block 1302. If the frame contains only payload bits, as determined at block 1306, then processing continues at block 1308 where the functional command is processed (e.g., read from memory, write to memory, etc.) and a partial CRC is computed at block 1310 for future use in calculating the CRC at block 1312.

If the frame does contain a change CRC command, as determined at block 1304, then processing continues at block 1320 where CRC checking is suspended. In accordance with one or more embodiments of the present invention, when the transmit side wants to make a change to the CRC rate and/or type it is performed in a very controlled manner to ensure that any current operations are not disrupted by a botched, or invalid, CRC check. Block 1322 is performed to update the CRC counters (e.g., to a higher CRC rate with fewer consecutive payload-only frames being frames having CRC bits) and or the type of CRC code as specified in the change CRC command. At block 1324, a transition window is entered. In the transmission window, the receive side now expects to only receive "special" frames until such time as it is ready to resume CRC checking with the new code and/or at the new rate.

At block 1326, every incoming frame is checked to make sure that it is a special frame (e.g., the frame generated at block 1208 of FIG. 12). The special frame is an arbitrarily agreed upon (by the transmit side and the receive side) frame designation that will not be mistaken for a functional operation or a normal idle frame. In this manner, the continuous transmission of the special frames provides the receive side the time that it requires to finish processing all pending operations related to frames received by the transmit side. If at any point during the transition window, an error occurs and the receiving sides sees something other than a "special" frame as determined at block 1328, then the receive side reports back an error to the transmitting side at block 1330. For example, if a normal read or write frame slipped in during the transition window, and the receiver processed it, this would result in an unchecked (and potentially untrusted) frame. However, assuming no errors occur and the transmitter (or driving side) continuously sends special frames, then the loop continues as long as the queue on the receiver has frames to process. While the receiver continues to process contents of the queues, it continues to send back responses to the transmitter at block 1334 based on the processing.

When the queues at the receiving side are empty, as determined at block 1332, then the receive side is quiesced and at block 1336, a send CRC change response is sent to the transmit side. When the next non-special frame (i.e., the frame is not a special frame) arrives at block 1338, the receive side checks it (and all subsequent frames) using the new CRC type or at the new CRC rate at blocks 1340 and 1342. At this point, the transmit side and receive side have safely transitioned to a new CRC rate and/or type without disrupting any work in progress, and without having to stop and restart the channel.

In accordance with one or more embodiments, the transmit side described in reference to FIGS. 12 and 13 which initiates the CRC change is a host computer and the receiving side is a memory buffer chip downstream from the host computer. In other embodiments, the CRC change is initiated by the memory buffer chip (the memory buffer is the transmit side) and the receive side is the host computer. In further embodiments that include an intelligent device (e.g., a GPU) attached to a host, either side can initiate a change to the CRC rate and/or type. No matter which side initiates the change, an orderly sequence of stopping the sending of new work, allowing the receive side to finish any pending work, then having the receive side report back when it's ready to begin checking with the new CRC rate and/or type is performed by embodiments. Once this sequence is complete, the transmitter can resume new work using the new CRC rate and/or type.

Processing continues at block 1336 once it is determined at block 1332 that queue of frames received prior to the change CRC command have been processed. A change response (e.g., an empty queue response) is sent to the transmitter at block 1336 and at block 1338 the receiver waits for the next frame. At block 1340, CRC compression is started and at block 1342 the new CRC rate and/or CRC type is set for incoming frames.

The CRC changes described above in FIG. 12 can also include a CRC MISR bit rate change and/or a MISR calculation change in addition to or instead of the CRC rate and/or type changes.

Figure 14:
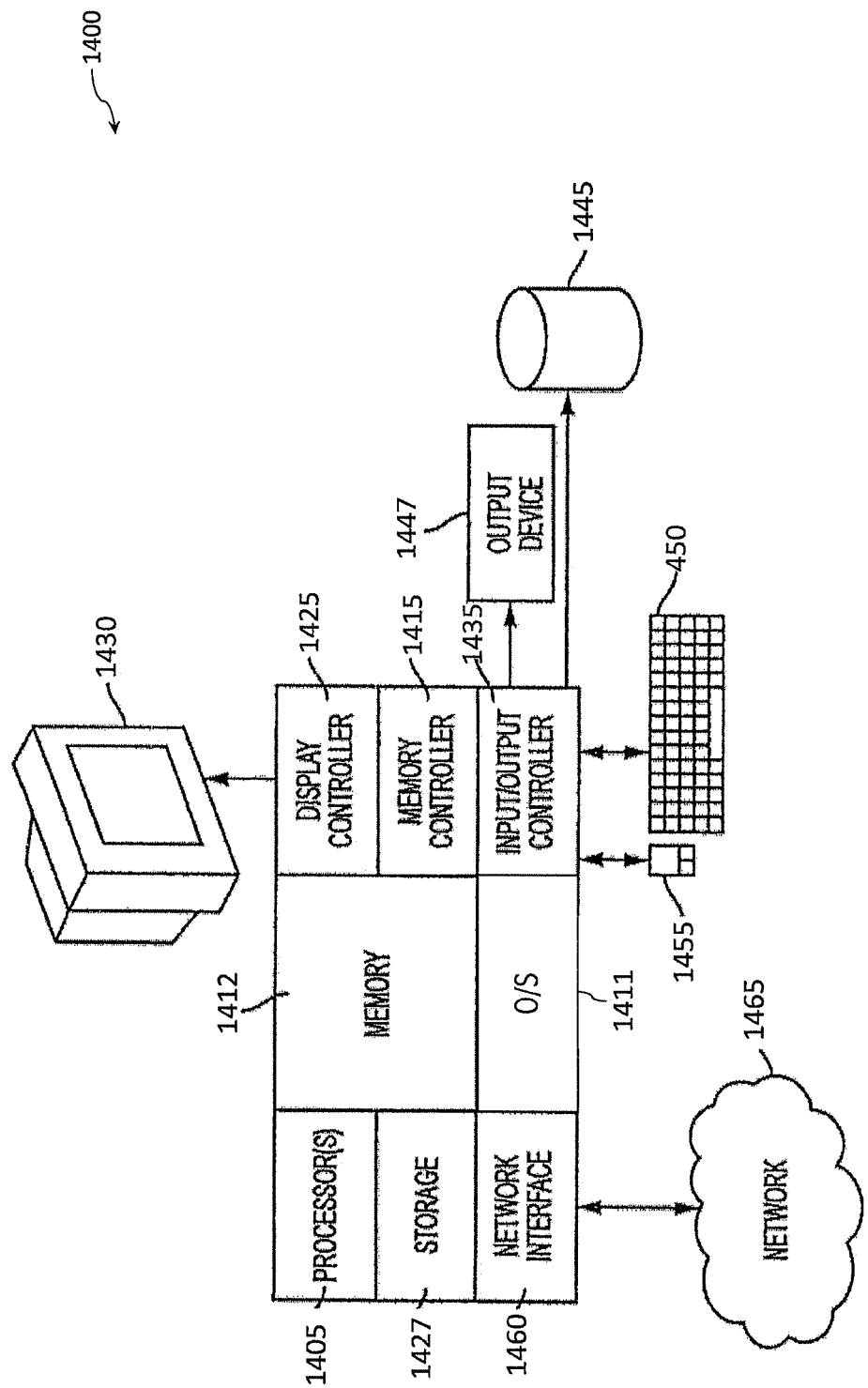
FIG. 14 is a block diagram of a computer system for implementing some or all aspects of dynamically adjustable CRC types in accordance with one or more embodiments of the present invention.

Turning now to FIG. 14, a block diagram of a computer system 1400 for implementing some or all aspects of using a CRC multiple-input shift register (MISR) to provide early warning and fail detection across a communication channel is generally shown according to one or more embodiments of the present invention. The processing described herein may be implemented in hardware, software (e.g., firmware), or a combination thereof. In an exemplary embodiment, the methods described may be implemented, at least in part, in hardware and may be part of the microprocessor of a special or general-purpose computer system 1400, such as a mobile device, personal computer, workstation, minicomputer, or mainframe computer.

In an exemplary embodiment, as shown in FIG. 14, the computer system 1400 includes a processor 1405, memory 1412 coupled to a memory controller 1415, and one or more input devices 1445 and/or output devices 1447, such as peripherals, that are communicatively coupled via a local I/O controller 1435. These devices 1447 and 1445 may include, for example, a printer, a scanner, a microphone, and the like. A conventional keyboard 1450 and mouse 1455 may be coupled to the I/O controller 1435. The I/O controller 1435 may be, for example, one or more buses or other wired or wireless connections, as are known in the art. The I/O controller 1435 may have additional elements, which are omitted for simplicity, such as controllers, buffers (caches), drivers, repeaters, and receivers, to enable communications.

The I/O devices 1447, 1445 may further include devices that communicate both inputs and outputs, for instance disk and tape storage, a network interface card (NIC) or modulator/demodulator (for accessing other files, devices, systems, or a network), a radio frequency (RF) or other transceiver, a telephonic interface, a bridge, a router, and the like.

The processor 1405 is a hardware device for executing hardware instructions or software, particularly those stored in memory 1412. The processor 1405 may be a custom made or commercially available processor, a central processing unit (CPU), an auxiliary processor among several processors associated with the computer system 1400, a semiconductor based microprocessor (in the form of a microchip or chip set), a microprocessor, or other device for executing instructions. The processor 1405 can include a cache such as, but not limited to, an instruction cache to speed up executable instruction fetch, a data cache to speed up data fetch and store, and a translation look-aside buffer (TLB) used to speed up virtual-to-physical address translation for both executable instructions and data. The cache may be organized as a hierarchy of more cache levels (L1, L2, etc.).

The memory 1412 may include one or combinations of volatile memory elements (e.g., random access memory, RAM, such as DRAM, SRAM, SDRAM, etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 1412 may incorporate electronic, magnetic, optical, or other types of storage media. Note that the memory 1412 may have a distributed architecture, where various components are situated remote from one another but may be accessed by the processor 1405.

The instructions in memory 1412 may include one or more separate programs, each of which comprises an ordered listing of executable instructions for implementing logical functions. In the example of FIG. 14, the instructions in the memory 1412 include a suitable operating system (OS) 1411. The operating system 1411 essentially may control the execution of other computer programs and provides scheduling, input-output control, file and data management, memory management, and communication control and related services.

Additional data, including, for example, instructions for the processor 1405 or other retrievable information, may be stored in storage 1427, which may be a storage device such as a hard disk drive or solid state drive. The stored instructions in memory 1412 or in storage 1427 may include those enabling the processor to execute one or more aspects of the dispatch systems and methods of this disclosure.

The computer system 1400 may further include a display controller 1425 coupled to a display 1430. In an exemplary embodiment, the computer system 1400 may further include a network interface 1460 for coupling to a network 1465. The network 1465 may be an IP-based network for communication between the computer system 1400 and an external server, client and the like via a broadband connection. The network 1465 transmits and receives data between the computer system 1400 and external systems. In an exemplary embodiment, the network 1465 may be a managed IP network administered by a service provider. The network 1465 may be implemented in a wireless fashion, e.g., using wireless protocols and technologies, such as WiFi, WiMax, etc. The network 1465 may also be a packet-switched network such as a local area network, wide area network, metropolitan area network, the Internet, or other similar type of network environment. The network 1465 may be a fixed wireless network, a wireless local area network (LAN), a wireless wide area network (WAN) a personal area network (PAN), a virtual private network (VPN), intranet or other suitable network system and may include equipment for receiving and transmitting signals.

Systems and methods for providing a dynamically adjustable CRC rate and/or CRC type across a communication channel as described herein can be embodied, in whole or in part, in computer program products or in computer systems 1400, such as that illustrated in FIG. 14.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method comprising:
monitoring bits received at a receiver via a communication channel for transmission errors, the monitoring comprising:
receiving frames of bits from a transmitter communicatively coupled to the receiver via the communication channel, the received frames of bits a subset of frames of bits used by the transmitter to generate a multi-frame cyclic-redundancy code (CRC), at least one of the received frames of bits comprising payload bits and a source single check bit not included in the multi-frame CRC, the source single check bit generated by the transmitter based at least in part on bits transmitted by the transmitter to the receiver subsequent to a last CRC check using the multi-frame CRC being performed;
determining whether a transmission error has occurred in the received frames of bits, the determining comprising:
generating a calculated single check bit based at least in part on bits in the received frames of bits subsequent to the last CRC check using the multi-frame CRC being performed; and
comparing the received source single check bit to the calculated single check bit, wherein a transmission error has occurred when the received source single check bit does not match the calculated single check bit; and
transmitting an error indication to the transmitter based on determining that a transmission error has occurred, wherein the error indication initiates a change in a CRC rate that is synchronized between the receiver and the transmitter and is performed in parallel with functional operations by the receiver.

2. The computer-implemented method of claim 1, wherein the source single check bit and the calculated single check bit are generated by multiple-input shift registers (MISRs).

3. The computer-implemented method of claim 1, wherein the source single check bit and the calculated single check bit are generated by linear-feedback shift registers (LFSRs).

4. The computer-implemented method of claim 1, wherein the source single check bit is received prior to performing a CRC check using the multi-frame CRC.

5. The computer-implemented method of claim 4, wherein the source single check bit is used to determine whether a transmission error has occurred in the received bit of frames prior to performing the CRC check using the multi-frame CRC.

6. The computer-implemented method of claim 1, wherein the error indication further initiates a change in a CRC rate that is synchronized between the receiver and the transmitter and is performed in parallel with functional operations by the receiver.

7. The computer-implemented method of claim 1, wherein the error indication further initiates a change in a CRC type that is synchronized between the receiver and the transmitter and is performed in parallel with functional operations by the receiver.

8. The computer-implemented method of claim 1, wherein the receiver is a distributed memory buffer, the transmitter is a host computer, and the communication channel comprises a plurality of memory channels.

9. The computer-implemented method of claim 1, wherein the receiver is a unified memory buffer, the transmitter is a host computer, and the communication channel is a memory channel.

10. The computer implemented method of claim 1, further comprising:
generating at the transmitter, the source single check bit based at least in part on the bits transmitted by the transmitter to the receiver across the communication channel; and
sending the source single check bit, via the communication channel, to the receiver.

11. The computer-implemented method of claim 1, wherein the source single check bit is received prior to performing a CRC check using the multi-frame CRC.

12. The computer-implemented method of claim 11, wherein the source single check bit is used to determine whether a transmission error has occurred in the received bit of frames prior to performing the CRC check using the multi-frame CRC.

13. A system comprising:
a receiver communicatively coupled to a transmitter via a communication channel, the receiver comprising:
a memory having computer readable instructions; and
one or more processors for executing the computer readable instructions, the computer readable instructions controlling the one or more processors to perform operations comprising:
monitoring bits received at the receiver via the communication channel for transmission errors, the monitoring comprising:
receiving frames of bits from the transmitter, the received frames of bits a subset of frames of bits used by the transmitter to generate a multi-frame cyclic-redundancy code (CRC), at least one of the received frames of bits comprising payload bits and a source single check bit not included in the multi-frame CRC, the source single check bit generated by the transmitter based at least in part on bits transmitted by the transmitter to the receiver subsequent to a last CRC check using the multi-frame CRC being performed;

determining whether a transmission error has occurred in the received frames of bits, the determining comprising:

generating a calculated single check bit based at least in part on bits in the received frames of bits subsequent to the last CRC check using the multi-frame CRC being performed; and comparing the received source single check bit to the calculated single check bit, wherein a transmission error has occurred when the received source single check bit does not match the calculated single check bit; and transmitting an error indication to the transmitter based on determining that a transmission error has occurred, wherein the error indication initiates a recovery sequence that is synchronized between the receiver and the transmitter and is performed in parallel with functional operations by the receiver.

14. The system of claim 13, wherein the source single check bit and the calculated single check bit are generated by multiple-input shift registers (MISRs).

15. The system of claim 13, wherein the source single check bit and the calculated single check bit are generated by linear-feedback shift registers (LFSRs).

16. The system of claim 13, wherein the receiver is a distributed memory buffer, the transmitter is a host computer, and the communication channel comprises a plurality of memory channels.

17. The system of claim 13, wherein the receiver is a unified memory buffer, the transmitter is a host computer, and the communication channel is a memory channel.

18. The system of claim 13, further comprising the transmitter, the transmitter configured to:

generate the source single check bit based at least in part on the bits transmitted by the transmitter to the receiver across the communication channel; and send the source single check bit, via the communication channel, to the receiver.

19. A computer program product comprising a computer readable storage medium having program instructions embodied therewith, the program instructions executable by a processor to cause the processor to perform operations comprising:

monitoring bits received at a receiver via a communication channel for transmission errors, the monitoring comprising:

receiving frames of bits from a transmitter communicatively coupled to the receiver via the communication channel, the received frames of bits a subset of frames of bits used by the transmitter to generate a multi-frame cyclic-redundancy code (CRC), at least one of the received frames of bits comprising payload bits and a source single check bit not included in the multi-frame CRC, the source single check bit generated by the transmitter based at least in part on bits transmitted by the transmitter to the receiver subsequent to a last CRC check using the multi-frame CRC being performed;

determining whether a transmission error has occurred in the received frames of bits, the determining comprising:

generating a calculated single check bit based at least in part on bits in the received frames of bits subsequent to the last CRC check using the multi-frame CRC being performed; and comparing the received source single check bit to the calculated single check bit, wherein a transmission error has occurred when the received source single check bit does not match the calculated single check bit; and transmitting an error indication to the transmitter based on determining that a transmission error has occurred, wherein the error indication initiates a change in a CRC rate that is synchronized between the receiver and the transmitter and is performed in parallel with functional operations by the receiver.

* * * * *